United States Patent
Yamashita et al.

(10) Patent No.: US 10,242,614 B2
(45) Date of Patent: Mar. 26, 2019

(54) DISPLAY DEVICE AND ELECTRONIC APPARATUS

(71) Applicant: Sony Corporation, Tokyo (JP)

(72) Inventors: Junichi Yamashita, Tokyo (JP); Katsuhide Uchino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 331 days.

(21) Appl. No.: 14/246,524

(22) Filed: Apr. 7, 2014

(65) Prior Publication Data

US 2014/0217388 A1     Aug. 7, 2014

Related U.S. Application Data

(63) Continuation of application No. 13/424,842, filed on Mar. 20, 2012, now abandoned, which is a
(Continued)

(30) Foreign Application Priority Data

Oct. 23, 2007    (JP) .................................. 2007-274752

(51) Int. Cl.
    *H01L 27/32*       (2006.01)
    *G09G 3/00*        (2006.01)
    (Continued)

(52) U.S. Cl.
    CPC .......... *G09G 3/3225* (2013.01); *G09G 3/3233* (2013.01); *H01L 27/326* (2013.01);
    (Continued)

(58) Field of Classification Search
    CPC .. G09G 3/325; G09G 3/36; G09G 2300/0426; G09G 3/3225; G09G 3/3233;
    (Continued)

(56) References Cited

U.S. PATENT DOCUMENTS

2002/0158835 A1* 10/2002 Kobayashi .......... H01L 27/3244
                                                      345/100
2004/0115989 A1*   6/2004 Matsueda ........... H01L 27/3276
                                                      439/577

(Continued)

FOREIGN PATENT DOCUMENTS

JP          2002-215063        7/2002
JP          2002-318556        10/2002

(Continued)

OTHER PUBLICATIONS

Japanese Office Action issued in connection with Japanese Patent Application No. 2008-259350 dated Dec. 11, 2012.

(Continued)

*Primary Examiner* — Hong Zhou
(74) *Attorney, Agent, or Firm* — Dentons US LLP

(57) ABSTRACT

A display device including: a plurality of sub-pixels arranged in a matrix, each including an electro-optical element having a structure in which a display functional layer is sandwiched between an upper electrode and a lower electrode; and an auxiliary interconnect contact in a pixel area in which the plurality of sub-pixels are arranged in a matrix and electrically connecting the upper electrode to an auxiliary interconnect, wherein m (m is an integer equal to or larger than two) sub-pixels adjacent to each other along an arrangement direction of the sub-pixels are regarded as one group, and n (n is a natural number smaller than m) auxiliary interconnect contacts are formed for each group.

4 Claims, 20 Drawing Sheets

Related U.S. Application Data continuation of application No. 12/255,265, filed on Oct. 21, 2008, now Pat. No. 8,179,339.

(51) Int. Cl.
  *G09G 3/32* (2016.01)
  *G09G 3/3225* (2016.01)
  *G09G 3/3233* (2016.01)
  *H01L 51/52* (2006.01)
  *G09G 3/3258* (2016.01)

(52) U.S. Cl.
  CPC ...... *H01L 27/3279* (2013.01); *H01L 51/5228* (2013.01); *G09G 3/3258* (2013.01); *G09G 2300/0426* (2013.01); *H01L 27/3211* (2013.01); *H01L 27/3218* (2013.01); *H01L 2227/32* (2013.01)

(58) Field of Classification Search
  CPC ............. G09G 3/3258; H01L 2227/32; H01L 27/3211; H01L 27/3218; H01L 27/326; H01L 27/3279; H01L 51/5228
  USPC ........................................ 345/76, 99
  See application file for complete search history.

(56) References Cited

U.S. PATENT DOCUMENTS

| | | | | |
|---|---|---|---|---|
| 2004/0263441 | A1* | 12/2004 | Tanaka | G09G 3/325 345/76 |
| 2005/0052371 | A1* | 3/2005 | Ozawa | G09G 3/30 345/76 |
| 2005/0099378 | A1* | 5/2005 | Kim | G02F 1/134309 345/99 |
| 2005/0179374 | A1* | 8/2005 | Kwak | H01L 27/3279 313/506 |
| 2007/0097072 | A1* | 5/2007 | Kim | G09G 3/3614 345/103 |
| 2007/0190887 | A1* | 8/2007 | Sato | H01L 27/3276 445/24 |

FOREIGN PATENT DOCUMENTS

| | | |
|---|---|---|
| JP | 2005-031651 | 2/2005 |
| JP | 2007-156387 | 6/2007 |
| JP | 2007-207217 | 8/2007 |
| JP | 2007-213999 | 8/2007 |
| JP | 2006-110141 | 11/2007 |
| WO | 2005-039248 | 4/2005 |

OTHER PUBLICATIONS

U.S. Office Action issued in connection with counterpart U.S. Appl. No. 12/255,265 dated Jun. 24, 2011.

* cited by examiner

F I G . 5
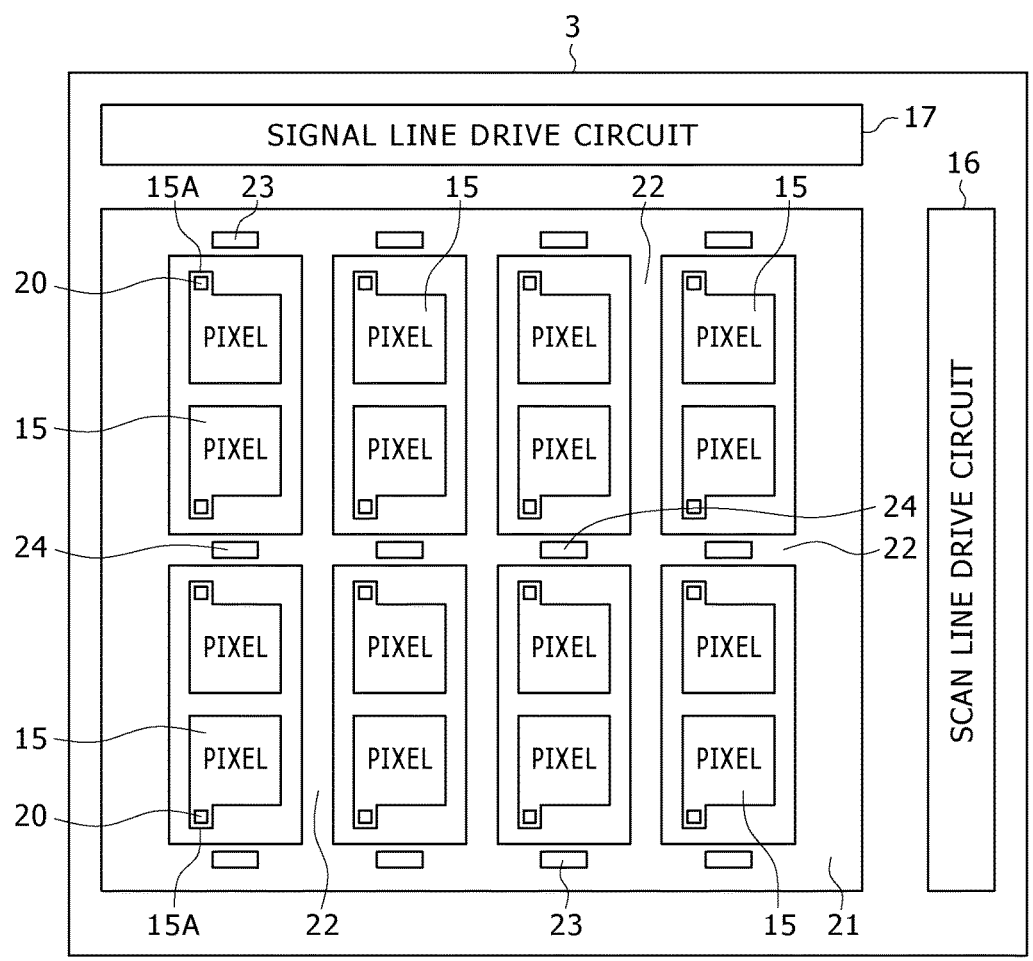

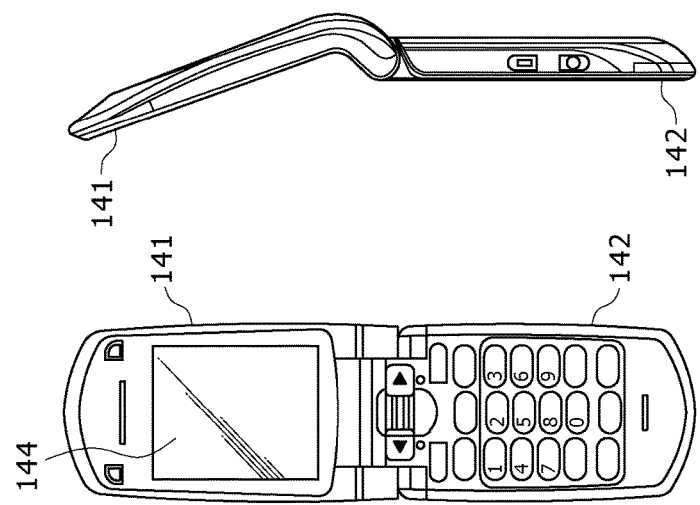
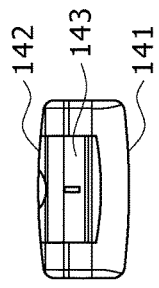
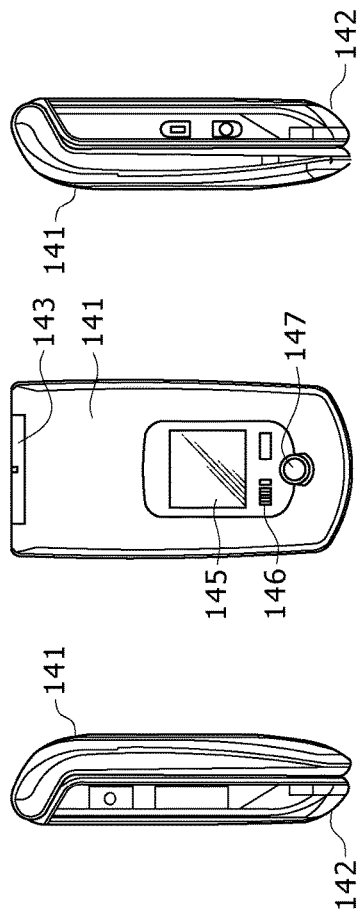
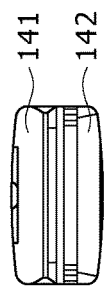

DISPLAY DEVICE AND ELECTRONIC APPARATUS

RELATED APPLICATION DATA

This application is a continuation of U.S. patent application Ser. No. 13/424,842, filed Mar. 20, 2012, which is a continuation of U.S. patent application Ser. No. 12/255,265, filed Oct. 21, 2008, now U.S. Pat. No. 8,179,339 issued on May 15, 2012, which are incorporated herein by reference in their entireties to the extent permitted by law. This application claims the benefit of priority to Japanese Patent Application No. 2007-274752 filed in the Japan Patent Office on Oct. 23, 2007, the entirely of which is incorporated herein by reference to the extent permitted by law.

BACKGROUND OF THE INVENTION

The present invention relates to a display device and an electronic apparatus, and particularly to a flat-type (flat-panel-type) display device in which pixels each including an electro-optical element are arranged on rows and columns (in a matrix), and an electronic apparatus having the display device.

In recent years, in the field of display devices for image displaying, flat-type display devices in which pixels each including a light emitting element are arranged in a matrix are rapidly becoming widespread. As one of the flat-type display devices, e.g. an organic electro luminescence (EL) display device is developed and commercialization thereof is being advanced. The organic EL display device includes organic EL elements as the light emitting elements of the respective pixels. The organic EL element is a so-called current-driven electro-optical element whose light emission luminance varies depending on the value of the current that flows through the element, and is based on a phenomenon that light emission occurs in response to electric field application to an organic thin film.

The organic EL display device has the following features. Specifically, the organic EL display device has low power consumption because the organic EL element can be driven by application voltage equal to or lower than 10 V. Furthermore, the organic EL element is a self-luminous element. Therefore, the organic EL display device provides higher image visibility compared with a liquid crystal display device, which displays an image by controlling, for each pixel including a liquid crystal cell, the intensity of light from a light source (backlight) by using the liquid crystal cell. In addition, the organic EL display device does not need to have an illuminating unit such as a backlight, which is necessary for the liquid crystal display device, and thus is allowed to easily achieve reduced weight and thickness. Moreover, the response speed of the organic EL element is as very high as several microseconds, which causes no image lag in displaying of a moving image by the organic EL display device.

As the drive system for the organic EL display device, a simple- (passive-) matrix system or an active-matrix system can be employed, similarly to the liquid crystal display device. However, a display device of the simple-matrix system involves e.g. a problem that it is difficult to realize a large-size and high-definition display device because the light emission period of the electro-optical element becomes shorter as the number of scan lines increases, although the structure of the simple-matrix display device is simple.

Therefore, currently, a display device of the active-matrix system predominates, in which the current that flows through an electro-optical element is controlled by an active element, such as an insulated gate field effect transistor (typically, thin film transistor (TFT)), provided in a pixel circuit corresponding to this electro-optical element. In the display device of the active-matrix system, the electro-optical element continues light emission over the one-frame period. This easily realizes a display device having large size and high definition.

In general, the organic EL element used in the organic EL display device has a structure in which an organic layer composed of an organic material is interposed between a cathode electrode and an anode electrode in a sandwiched manner. For the light emission of the organic EL element, positive voltage is applied to the anode electrode and negative electrode is applied to the cathode electrode. Due to this voltage application, holes are injected into the organic layer from the anode electrode side and electrons are injected from the cathode electrode side. These holes and electrons recombine with each other inside the organic layer (light emitting layer), which causes the light emission.

The pixels as the minimum unit of image displaying by the organic EL display device (hereinafter, referred to as the "sub-pixels") are so provided as to be separated for each of colors of red (R), green (G), and blue (B) as three primary colors of light. Each sub-pixel includes an organic EL element as an electro-optical element and a pixel contact for electrically connecting this organic EL element to a pixel circuit. The pixel circuit is a circuit to control the current that flows through the electro-optical element (organic EL element). Typically, the pixel circuit and the sub-pixel are provided with the one-to-one correspondence relationship.

It is effective that an active-matrix display device has a so-called top-face light extraction structure (hereinafter, referred to as the "top-emission structure") for extracting light from the opposite side to a transparent insulating substrate on which the pixel circuits are formed, in order to assure a high aperture ratio of the organic EL element. In the organic EL display device of the top-emission structure, an upper electrode that sandwiches the organic layer together with a lower electrode is formed of e.g. a very thin metal film in order to assure high optical transmittance. Therefore, the sheet resistance of the upper electrode is high, and thus a voltage drop easily occurs when voltage is applied to the upper electrode.

To address this problem, a structure to prevent a voltage drop in the upper electrode has been proposed as a related art. In this structure, an auxiliary interconnect is formed at the same layer level as that of the lower electrode by using a low-resistance metal material (e.g. silver, aluminum), and the upper electrode is electrically connected to this auxiliary interconnect via an auxiliary interconnect contact (refer to e.g. Japanese Patent Laid-open No. 2004-207217).

SUMMARY OF THE INVENTION

FIG. 24 is a schematic plan view showing the layout in an organic EL display device of a top-emission structure. For a substrate 51 for forming organic EL elements (hereinafter, referred to as the "element formation substrate"), a transparent glass substrate is used as a transparent insulating substrate. An auxiliary electrode 52 is formed into a rectangular frame shape on the element formation substrate 51. Plural sub-pixels 53 are arranged in a matrix in the area surrounded by the auxiliary electrode 52 (hereinafter, referred to as the "pixel area"). In each sub-pixel 53, a pixel contact 54 is provided.

The pixel contact 54 is provided to electrically connect, of the cathode electrode and the anode electrode that sandwich the organic layer as described above, a pixel electrode formed for each sub-pixel 53 separately to the pixel circuit (not shown). The pixel electrode sandwiches the organic layer together with a common electrode opposed to the pixel electrode. The common electrode is formed as a blanket electrode layer common to all of the sub-pixels 53. When the element formation substrate 51 is horizontally disposed, the pixel electrode and the common electrode serve as the lower electrode and the upper electrode, respectively, and the upper electrode side corresponds to the light extraction side.

In the pixel area surrounded by the auxiliary electrode 52, auxiliary interconnects 55 are so formed vertically and horizontally as to extend among the respective sub-pixels 53. The auxiliary interconnects 55 are formed together with the auxiliary electrode 52 at the same layer level as that of the pixel electrodes (not shown). The above-described upper electrode (common electrode) is electrically connected to the auxiliary electrode 52 via plural auxiliary electrode contacts 56. Furthermore, the upper electrode is electrically connected to the auxiliary interconnects 55 via plural auxiliary interconnect contacts 57.

However, in this organic EL display device, the auxiliary interconnect contacts 57 exist between the respective two of all of the sub-pixels 53 adjacent to each other along the row direction (vertical direction). Therefore, in accordance with the rule of the manufacturing process and the design rule, the area for forming the auxiliary interconnects 55 and the auxiliary interconnect contacts 57 needs to be ensured between the respective two of all of the sub-pixels 53 adjacent to each other along the row direction. This results in the state in which the sub-pixels are arranged with low density in the pixel area.

According to an embodiment of the present invention, there is provided a display device including a plurality of sub-pixels configured to be arranged in a matrix and each include an electro-optical element having a structure in which a display functional layer is sandwiched between an upper electrode and a lower electrode, and an auxiliary interconnect contact configured to be formed in a pixel area in which the plurality of sub-pixels are arranged in a matrix and electrically connect the upper electrode to an auxiliary interconnect. In the display device, m (m is an integer equal to or larger than two) sub-pixels adjacent to each other along an arrangement direction of the sub-pixels are regarded as one group, and n (n is a natural number smaller than m) auxiliary interconnect contacts are formed for each group.

In the display device according to the embodiment of the present invention and an electronic apparatus having the display device, m sub-pixels adjacent to each other along an arrangement direction of the sub-pixels are regarded as one group, and n auxiliary interconnect contacts are formed for each group. This makes it possible to arrange the sub-pixels with smaller pixel distance and hence higher density along the arrangement direction thereof, compared with related arts.

According to the embodiment of the present invention, in a display device in which an upper electrode is electrically connected to an auxiliary interconnect to thereby decrease the resistance of the upper electrode, sub-pixels can be arranged with smaller pixel distance and hence higher density along the arrangement direction thereof, compared with related arts. Thus, enhancement in the aperture ratio of the pixels and the definition of displaying can be realized.

BRIEF DESCRIPTION OF THE DRAWINGS

FIG. 5 is a schematic plan view showing the layout in an organic EL display device according to a first embodiment of the present invention;

FIGS. 23A to 23G are diagrams showing a portable terminal apparatus as a fifth application example.

DETAILED DESCRIPTION OF THE PREFERRED EMBODIMENTS

Embodiments of the present invention will be described in detail below with reference to the accompanying drawings.

<Configuration of Display Device>

Figure 1:
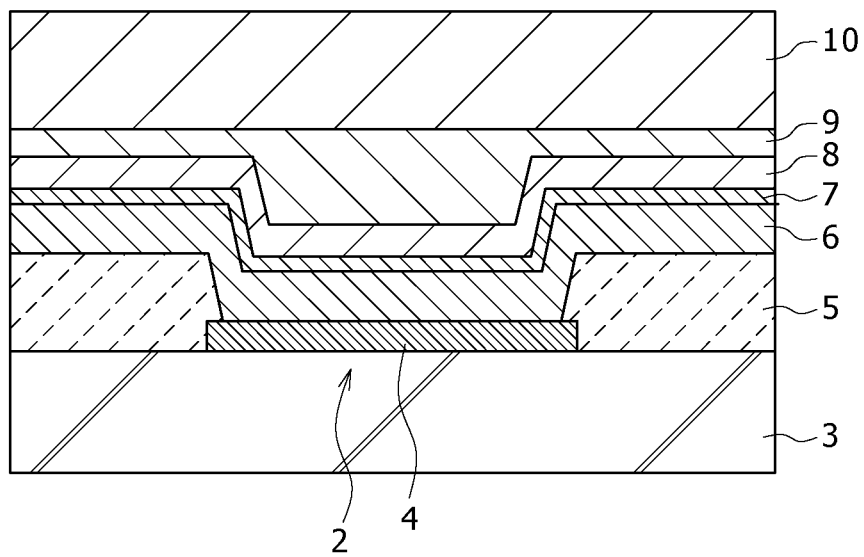
FIG. 1 is a sectional view showing the configuration of major part of a display device to which an embodiment of the present invention is applied.

FIG. 1 is a sectional view showing the configuration of major part of a display device to which an embodiment of the present invention is applied. As one example, the following description will deal with an active-matrix organic EL display device that employs, as a light emitting element of each pixel, an organic EL element (organic electro luminescence element), which is a current-driven electro-optical element whose light emission luminance varies depending on the current that flows through the element.

An organic EL display device 1 is formed by using plural (a large number of) organic EL elements 2. The organic EL elements 2 are separated for each sub-pixel based on the difference of the light emission color among red (R), green (G), and blue (B). FIG. 1 shows only one of these organic EL elements 2.

The organic EL element 2 is formed by using an element formation substrate 3. Over the element formation substrate 3, in addition to a pixel circuit (not shown) including an active element (e.g. thin film transistor), a lower electrode 4, an insulating layer 5, an organic layer 6, and an upper electrode 7 are sequentially stacked. The upper electrode 7 is covered by a protective layer 8, and a counter substrate 10 is disposed over this protective layer 8 with the intermediary of an adhesive layer 9 therebetween. The organic EL element 2 has a structure in which the organic layer 6 composed of an organic material is interposed between the lower electrode 4 and the upper electrode 7 in a sandwiched manner.

Each of the element formation substrate 3 and the counter substrate 10 is formed of a transparent glass substrate (insulating substrate). The element formation substrate 3 and the counter substrate 10 are disposed to face each other in such a way that the lower electrode 4, the insulating layer 5, the organic layer 6, the upper electrode 7, the protective layer 8, and the adhesive layer 9 are sandwiched between these two substrates.

One of the lower electrode 4 and the upper electrode 7 serves as the anode electrode, and the other serves as the cathode electrode. The lower electrode 4 is composed of a highly-reflective material if the organic EL display device 1 is a top-emission display device, and it is composed of a transparent material if the organic EL display device 1 is a transmissive display device.

The structure of FIG. 1 is based on an assumption that the organic EL display device 1 is a top-emission display device and the lower electrode 4 and the upper electrode 7 serve as the anode electrode and the cathode electrode, respectively, as one example. In this case, the lower electrode 4 is formed for each sub-pixel separately, and thus is equivalent to the pixel electrode. In contrast, the upper electrode 7 serves as the common electrode that is common to all of the sub-pixels. Thus, the upper electrode 7 is formed into a blanket film state across the entire surface of the element formation substrate 3 in such a manner as to cover the organic layer 6. The lower electrode 4 is composed of any of the following electrically-conductive materials with high reflectivity and alloys of these materials: silver (Ag), aluminum (Al), chromium (Cr), iron (Fe), cobalt (Co), nickel (Ni), copper (Cu), tantalum (Ta), tungsten (W), platinum (Pt), and gold (Au).

If the organic EL display device 1 is a top-emission display device and the lower electrode 4 is the cathode electrode, the lower electrode 4 is composed of an electrically-conductive material having a low work function and high optical reflectivity, such as aluminum (Al), indium (In), magnesium (Mg)-silver (Ag) alloy, lithium (Li)-fluorine (F) compound, lithium-oxygen (O) compound.

If the organic EL display device 1 is a transmissive display device and the lower electrode 4 is the anode electrode, the lower electrode 4 is composed of an electrically-conductive material having high transmittance, such as indium tin oxide (ITO) or indium zinc oxide (IZO). If the organic EL display device 1 is a transmissive display device and the lower electrode 4 is the cathode electrode, the lower electrode 4 is composed of an electrically-conductive material having a low work function and high optical transmittance.

The insulating layer 5 is formed on the top surface of the element formation substrate 3 in such a manner as to cover the peripheral part of the lower electrode 4. A window is formed in the insulating layer 5 for each sub-pixel, and the lower electrode 4 is exposed through the aperture part of this window. This insulating layer 5 is formed by using e.g. an organic insulating material such as polyimide or photoresist, or an inorganic insulating material such as silicon oxide.

Figure 2:
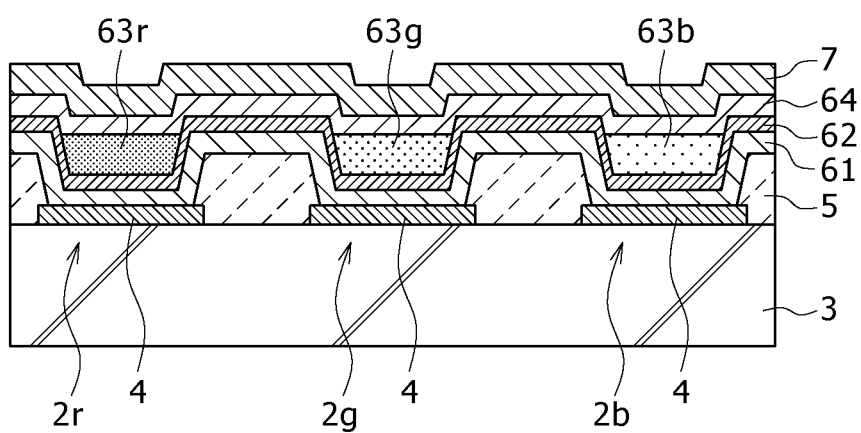
FIG. 2 is a sectional view showing one example of the multilayer structure of organic EL elements.

The organic layer 6 is formed as a display functional layer between the lower electrode 4 and the upper electrode 7. As shown in FIG. 2, the organic layer 6 has e.g. a four-layer multilayer structure arising from stacking of a hole injection layer 61, a hole transport layer 62, a light emitting layer 63 (63r, 63g, 63b), and an electron transport layer 64 in that order from the element formation substrate 3 side.

The hole injection layer 61 is composed of e.g. m-MT-DATA[4,4,4-tris(3-methylphenylphenylamino)triphenylamine]. The hole transport layer 62 is composed of e.g. α-NPD [4,4-bis(N-1-naphthyl-N-phenylamino)biphenyl]. The material is not limited thereto, but another hole transport material such as a benzidine derivative, styrylamine derivative, triphenylmethane derivative, or hydrazone derivative can be used. Each of the hole injection layer 61 and the hole transport layer 62 may have a multilayer structure composed of plural layers.

The light emitting layers 63 are composed of organic light emitting materials different for each of the RGB color components. Specifically, the red light emitting layer 63r is composed of e.g. a material prepared by doping ADN as a host material with 30-wt. % 2,6≡bis[(4'≡methoxydiphenylamino)styryl]≡1,5≡dicyanonaphthalene (BSN) as a dopant material. The green light emitting layer 63g is composed of e.g. a material prepared by doping ADN as a host material with 5-wt. % coumarin 6 as a dopant material. The blue light emitting layer 63b is composed of e.g. a material prepared by doping ADN as a host material with 2.5-wt. % 4,4'≡bis [2≡{4≡(N,N≡diphenylamino)phenyl}vinyl]biphenyl (DPAVBi) as a dopant material. In matching with the color arrangement of the pixels, the light emitting layers 63r, 63g, and 63b of the respective colors are arranged in a matrix similar to that of the sub-pixels, or arranged as strips parallel to the row direction of the sub-pixels.

The electron transport layer 64 is composed of e.g. 8≡hydroxyquinoline aluminum (Alq3). The structure of the organic layer 6 is not limited to the four-layer structure shown in FIG. 2, but any structure may be employed as long as the organic layer 6 includes at least the light emitting layer. Specifically, the organic layer 6 may have a five-layer structure obtained by adding an electron injection layer (not shown) to the above-described four layers (hole injection layer, hole transport layer, light emitting layers, electron transport layer). Alternatively, it may have a structure with a smaller or larger number of layers.

The upper electrode 7 is composed of a transparent or semi-transparent electrically-conductive material, such as a very thin metal film, ITO, or IZO, if the organic EL display device 1 is a top-emission display device, and it is composed of a highly-reflective material if the organic EL display device 1 is a transmissive display device. In particular, if the organic EL display device 1 is a top-emission display device, the upper electrode 7, which is on the light extraction side, needs to have both optical transparency and electrical conductivity. Therefore, the electric resistance (sheet resistance) of the upper electrode 7 is higher than that of the lower electrode 4, which is formed by using a low-resistance material such as aluminum or silver.

Based on the lower electrode 4, the insulating layer 5, the organic layer 6, and the upper electrode 7 thus formed over the element formation substrate 3, the organic EL element 2 (red organic EL element 2r, green organic EL element 2g, blue organic EL element 2b) is formed.

The protective layer 8 is formed for the purpose of preventing water from reaching the upper electrode 7 and the organic layer 6 and other purposes. Thus, the protective layer 8 is formed to a sufficient thickness by using a material with low water permeability and low water absorbability. If the organic EL display device 1 is a top-emission display device, the protective layer 8 needs to allow the passage of light emitted by the organic layer 6 therethrough, and therefore is composed of a material having optical transparency of about 80%.

If the upper electrode 7 is formed of a metal thin film and the insulating protective layer 8 is formed directly on this metal thin film, as the material of the protective layer 8, an inorganic amorphous insulating material such as amorphous silicon ($\alpha$-Si), amorphous silicon carbide ($\alpha$-SiC), amorphous silicon nitride ($\alpha$-Si1–xNx), or amorphous carbon ($\alpha$-C) can be favorably used. Such an inorganic amorphous insulating material includes no grain and thus has low water permeability, and hence provides the favorable protective film 8.

The adhesive layer 9 is composed of e.g. UV (ultra-violet rays) curing resin. The adhesive layer 9 is to fix the counter substrate 10.

Although not shown in the drawing, in the case of combining a color filter with the organic EL display device 1 having such a configuration, color filters that each allow the passage of only light around the peak wavelength of the spectrum of light emission by a corresponding one of the organic EL elements 2r, 2g, and 2b of the respective RGB colors are provided on the light extraction surface side of the organic EL elements 2r, 2g, and 2b of the respective colors.

<Configuration of Drive Circuit>

Figure 3:
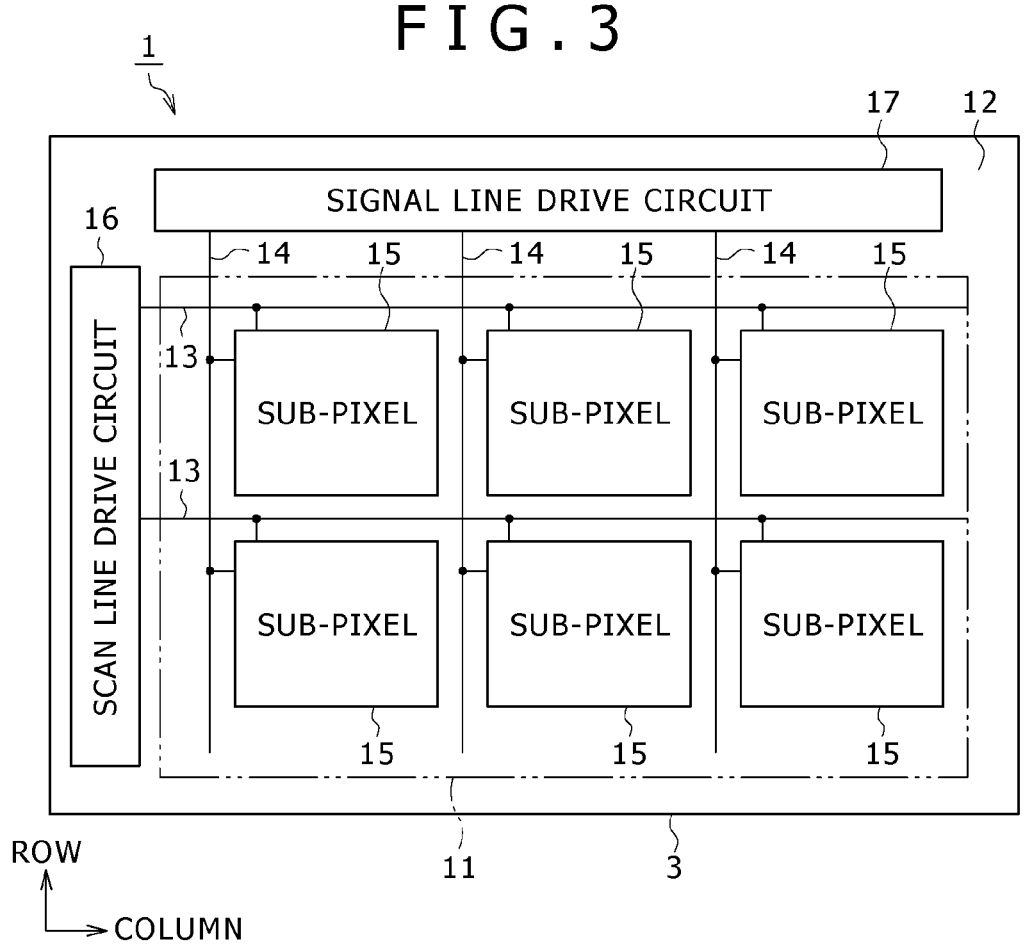
FIG. 3 is a diagram showing a configuration example of a drive circuit in the organic EL display device.

FIG. 3 is a diagram showing a configuration example of a drive circuit in the organic EL display device. The drive circuit of the organic EL display device 1 is formed over the element formation substrate 3. More specifically, a display area 11 including the pixel area and a peripheral area 12 thereof are defined on the element formation substrate 3. In the display area 11, plural scan lines 13 and plural signal lines 14 are disposed horizontally and vertically. One sub-pixel 15 is provided at each of the intersections of the scan lines 13 and the signal lines 14. The plural (a large number of) sub-pixels 15 are arranged in a matrix in the display area 11. The arrangement directions of the sub-pixels 15 on the element formation substrate 3 are the row direction equivalent to the vertical direction on the display screen (the upward and downward directions in the drawing) and the column direction equivalent to the horizontal direction on the display screen (the leftward and rightward directions in the drawing). Each of the sub-pixels 15 includes the above-described organic EL element 2. Disposed in the peripheral area 12 are a scan line drive circuit 16 for scan-driving of the scan lines 13 and a signal line drive circuit 17 that supplies video signals (i.e. input signals) dependent upon luminance information to the signal lines 14.

<Configuration of Pixel Circuit>

Figure 4:
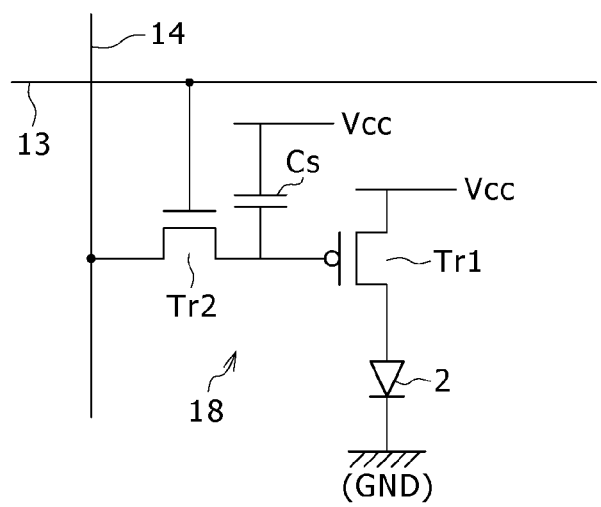
FIG. 4 is a diagram showing a configuration example of a pixel circuit.

FIG. 4 is a diagram showing a configuration example of the pixel circuit. This pixel circuit 18 is a circuit to control the current that flows through the organic EL element 2. In FIG. 4, the pixel circuit 18 corresponding to one sub-pixel is formed by using a drive transistor Tr1, a write transistor Tr2, and a hold capacitor Cs, as one example. In this pixel circuit 18, due to driving by the scan line drive circuit 16, a video signal written from the signal line 14 via the write transistor Tr2 is held in the hold capacitor Cs, and the current dependent upon the amount of the held signal is supplied from the drive transistor Tr1 to the organic EL element 2, so that the organic EL element 2 emits light with the luminance dependent upon the current value.

This pixel circuit configuration is merely one example, and the pixel circuit may further include an additional capacitive element and plural transistors according to need. Furthermore, a requisite drive circuit may be added to the peripheral area 12 depending on the change of the pixel circuit.

First Embodiment

Figure 6:
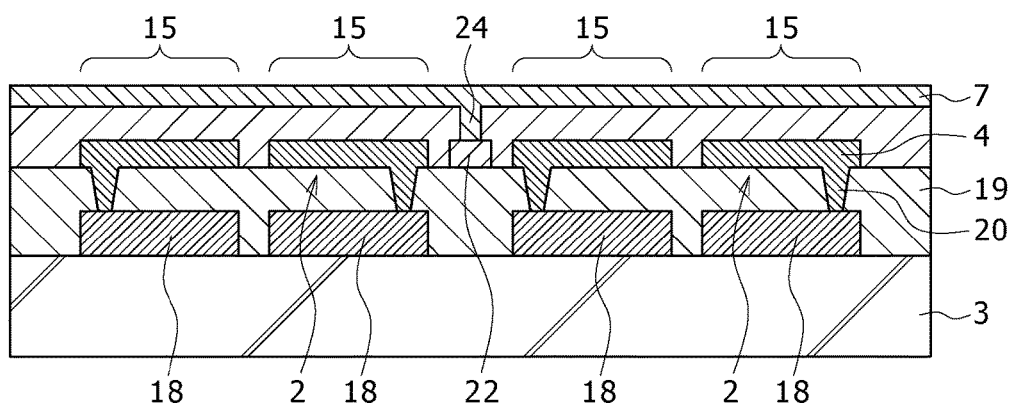
FIG. 6 is a sectional view of major part of the organic EL display device of the first embodiment of the present invention.

FIG. 5 is a schematic plan view showing the layout in an organic EL display device according to a first embodiment of the present invention. FIG. 6 is a sectional view of major part of the organic EL display device of the first embodiment.

The pixel circuit 18 is formed on the element formation substrate 3 together with the organic EL element 2. For example, the pixel circuit 18 is formed on the element formation substrate 3 by using publicly-known thin film forming technique, patterning technique, and so on, and the organic EL element 2 is formed on an insulating planarization film (interlayer insulating film) 19 that covers this pixel circuit 18. The lower electrode (anode electrode, in the present form example) 4 of the organic EL element 2 is electrically connected to the pixel circuit 18 via a pixel contact 20. The pixel contact 20 is formed e.g. by, in the manufacturing step of the organic EL display device 1, forming a connection hole that reaches the pixel circuit 18 in the planarization film 19 and filling this connection hole with an electrically-conductive material after forming the planarization film 19 that covers the pixel circuit 18 over the element formation substrate 3.

Furthermore, an auxiliary electrode 21 is formed into a rectangular frame shape over the element formation substrate 3. The plural sub-pixels 15 are arranged in a matrix inside the frame of this auxiliary electrode 21, i.e. in the pixel area, and auxiliary interconnects 22 are formed along the horizontal and vertical directions in the pixel area. In the example of FIG. 5, for convenience of description, total 16 sub-pixels 15 on four rows×four columns are arranged in the pixel area. In addition, the uppermost row is defined as the first row, and the leftmost column is defined as the first column.

In each sub-pixel 15, one pixel contact 20 for the electrical connection to the pixel circuit 18 is provided. The pixel contact 20 is formed on a protrusion 15A arising from partial protrusion from one side of the rectangular shape of the lower electrode 4, if the lower electrode 4, which defines the planar size (area) of the sub-pixel 15, is formed into the rectangular shape in plan view. The reason why the pixel contact 20 is formed on the protrusion 15A of the sub-pixel 15 in this manner is as follows.

Specifically, when the organic EL element 2 is caused to emit light through current application thereto, the desired light emission state can not be obtained at the formation part of the pixel contact 20. Thus, in general, the formation part of the pixel contact 20 is masked so as to be a non-light-emission part. In this case, if the area of the sub-pixel 15 is so enlarged as to encompass the protrusion 15A and thereby the outer shape of this sub-pixel 15 is set to a rectangular shape for example, one part of this rectangular shape (the formation part of pixel contact 20) becomes the non-light-emission part. Consequently, the outer shape of a light emitting pixel becomes an irregular shape arising from cutting-off of one part of the rectangular shape. In contrast, if the pixel contact 20 is formed on the protrusion 15A of the sub-pixel 15 as described above, the outer shape of a light emitting pixel is a regular rectangular shape suitable for image displaying.

The auxiliary electrode 21 and the auxiliary interconnects 22 are formed on the planarization film 19 simultaneously with the lower electrode 4, in order to decrease the resistance of the upper electrode 7 (prevent a voltage drop in the upper electrode 7). Therefore, the auxiliary electrode 21 and the auxiliary interconnects 22 are formed at the same layer level as that of the lower electrode 4 by using the same electrically-conductive material as that of the lower electrode 4. The auxiliary interconnects 22 are formed in a continuous manner from the auxiliary electrode 21 toward the pixel area. More specifically, the vertical auxiliary interconnects 22 along the row direction are formed into vertical straight lines between the sub-pixels 15 adjacent to each other along the column direction at intervals of every one sub-pixel. The horizontal auxiliary interconnects 22 along the column direction are formed into horizontal straight lines between the sub-pixels 15 adjacent to each other along the row direction at intervals of every two sub-pixels.

On the other hand, each sub-pixel 15 is formed in the rectangular area defined by the auxiliary electrode 21 and the auxiliary interconnects 22 in such a manner as to be isolated from the auxiliary electrode 21 and the auxiliary interconnects 22. Therefore, although the auxiliary electrode 21 and the auxiliary interconnects 22 are electrically connected to each other, the lower electrode 4, which is formed for each sub-pixel 15, is electrically insulated from the auxiliary electrode 21 and the auxiliary interconnects 22.

The upper electrode 7 is electrically connected to the auxiliary electrode 21 via plural auxiliary electrode contacts 23. Furthermore, the upper electrode 7 is electrically connected to the auxiliary interconnects 22 via plural auxiliary interconnect contacts 24. The respective auxiliary electrode contacts 23 are provided in the formation area of the auxiliary electrode 21 surrounding the pixel area. The respective auxiliary interconnect contacts 24 are provided in the formation area (within the interconnect width) of the auxiliary interconnects 22 disposed in the pixel area. Therefore, the auxiliary electrode contacts 23 are disposed outside the pixel area, and the auxiliary interconnect contacts 24 are disposed inside the pixel area.

The auxiliary electrode contacts 23 and the auxiliary interconnect contacts 24 are formed e.g. by, in the manufacturing step of the organic EL display device 1, forming connection holes that penetrate the insulating layer 5 and reach the auxiliary electrode 21 and the auxiliary interconnects 22 and filling the connection holes with the material (electrically-conductive material) of the upper electrode 7 before forming the upper electrode 7 over the element formation substrate 3.

As a feature of the display device according to an embodiment of the present invention, m (m is an integer equal to or larger than two) sub-pixels 15 adjacent to each other along the row direction and/or the column direction as the arrangement directions of the sub-pixels 15 are regarded as one group, and n (n is a natural number smaller than m) auxiliary interconnect contacts 24 are formed for each group. In the first embodiment, two sub-pixels 15 adjacent to each other along the row direction are regarded as one group, and one auxiliary interconnect contact 24 is formed for each group. Specifically, for the sub-pixels 15 on the first column, the auxiliary interconnect 22 is formed between the group composed of the upper two sub-pixels 15 and the group composed of the lower two sub-pixels 15, and one auxiliary interconnect contact 24 is provided on this auxiliary interconnect 22. This feature applies also to the sub-pixels 15 on the second, third, and fourth columns.

In FIG. 5, four sub-pixels 15 are arranged along the row direction, and therefore only one horizontal auxiliary interconnect 22 is formed for each column. However, in practice, a large number of sub-pixels 15 are arranged along the row direction, and thus the number of horizontal auxiliary interconnects 22 also increases correspondingly. For example, although not shown in a drawing, when 16 sub-pixels 15 are arranged along the row direction on each column, the number of horizontal auxiliary interconnects 22 per one column is seven, and thus the number of auxiliary interconnect contacts 24 per one column is also seven.

Employing such a layout eliminates the need to ensure the area for forming the auxiliary interconnect contacts 24 between the sub-pixels 15 on the first row and the sub-pixels 15 on the second row, although there is a need to ensure the area for forming the auxiliary interconnect contacts 24 between the sub-pixels 15 on the second row and the sub-pixels 15 on the third row, for example. Thus, of the respective sub-pixels 15 adjacent to each other along the row direction, the sub-pixels 15 on the first row and the sub-pixels 15 on the second row can be disposed with the intermediary of a distance therebetween smaller than that between the sub-pixels 15 on the second row and the sub-pixels 15 on the third row.

Figure 24:
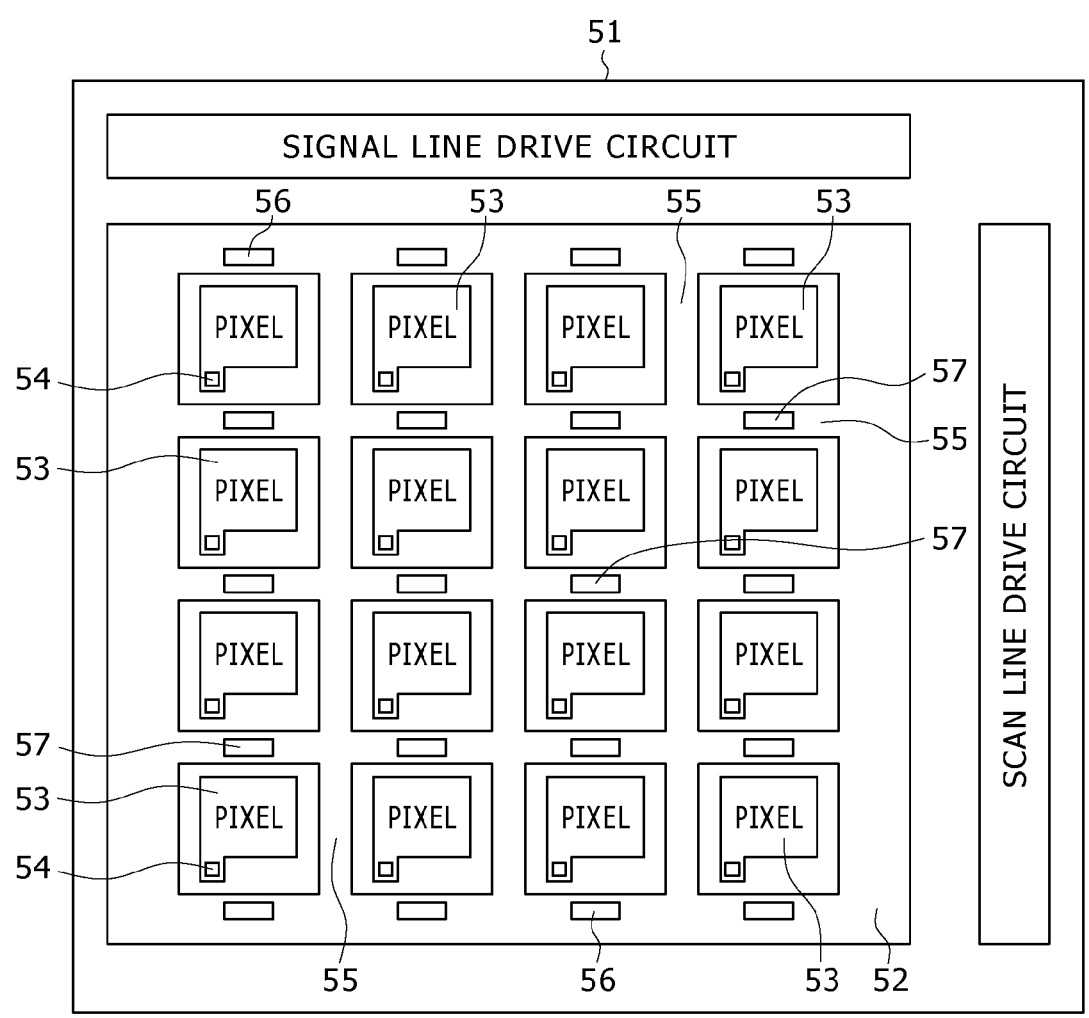
FIG. 24 is a schematic plan view showing the layout in an organic EL display device.

Therefore, the sub-pixels 15 can be arranged along the row direction with higher density compared with the layout of FIG. 24. As a result, the occupation area of the sub-pixels 15 (the lower electrodes 4) in the pixel area can be increased. Thus, enhancement in the aperture ratio of the pixels can be realized. The enhancement in the aperture ratio of the pixels allows suppression of the value (density) of the current that flows through the organic EL element 2 per unit area, and thus contributes to extension of the life of the organic EL element 2. Furthermore, if the pixel size in the first embodiment is the same as that in the layout of FIG. 24, a larger number of sub-pixels 15 can be disposed in the pixel area in the first embodiment. This can realize enhancement in the definition of displaying.

Second Embodiment

Figure 7:
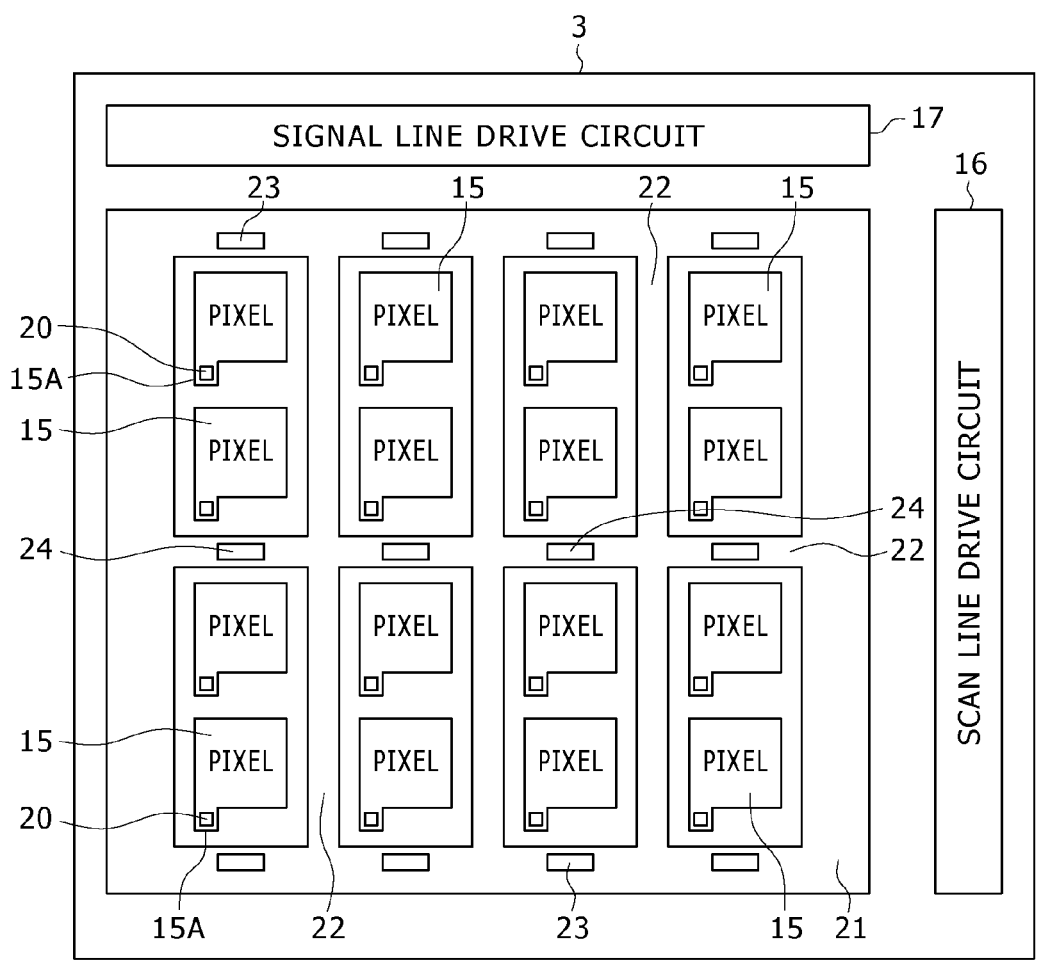
FIG. 7 is a schematic plan view showing the layout in an organic EL display device according to a second embodiment of the present invention.

FIG. 7 is a schematic plan view showing the layout in an organic EL display device according to a second embodiment of the present invention.

The second embodiment is the same as the first embodiment in that two sub-pixels 15 adjacent to each other along the row direction are regarded as one group and one auxiliary interconnect contact 24 is formed for each group, but is different from the first embodiment in the positional relationship between the pixel contacts 20 provided for the sub-pixels 15 in each group. Specifically, in the first embodiment, of the upper and lower two sub-pixels 15 of the same group, one sub-pixel 15 has the pixel contact 20 near the upper left corner thereof, and the other sub-pixel 15 has the pixel contact 20 near the lower left corner thereof. In contrast, in the second embodiment, of the upper and lower two sub-pixels 15 of the same group, one sub-pixel 15 has the pixel contact 20 near the lower left corner thereof, and the other sub-pixel 15 also has the pixel contact 20 near the lower left corner thereof.

Specifically, in the first embodiment, the positions of the pixel contacts 20 of the upper and lower two sub-pixels 15 of the same group are inverted from each other along the row direction (vertically inverted). In contrast, in the second embodiment, the positions of the pixel contacts 20 of the upper and lower two sub-pixels 15 of the same group are not inverted from each other along the row direction but aligned with each other (i.e., the pixel contacts 20 are disposed at the same position with respect to the sub-pixel 15). Therefore, in the layout of the second embodiment, the distance between the upper and lower two sub-pixels 15 of the same group is larger than that in the first embodiment.

Figure 8:
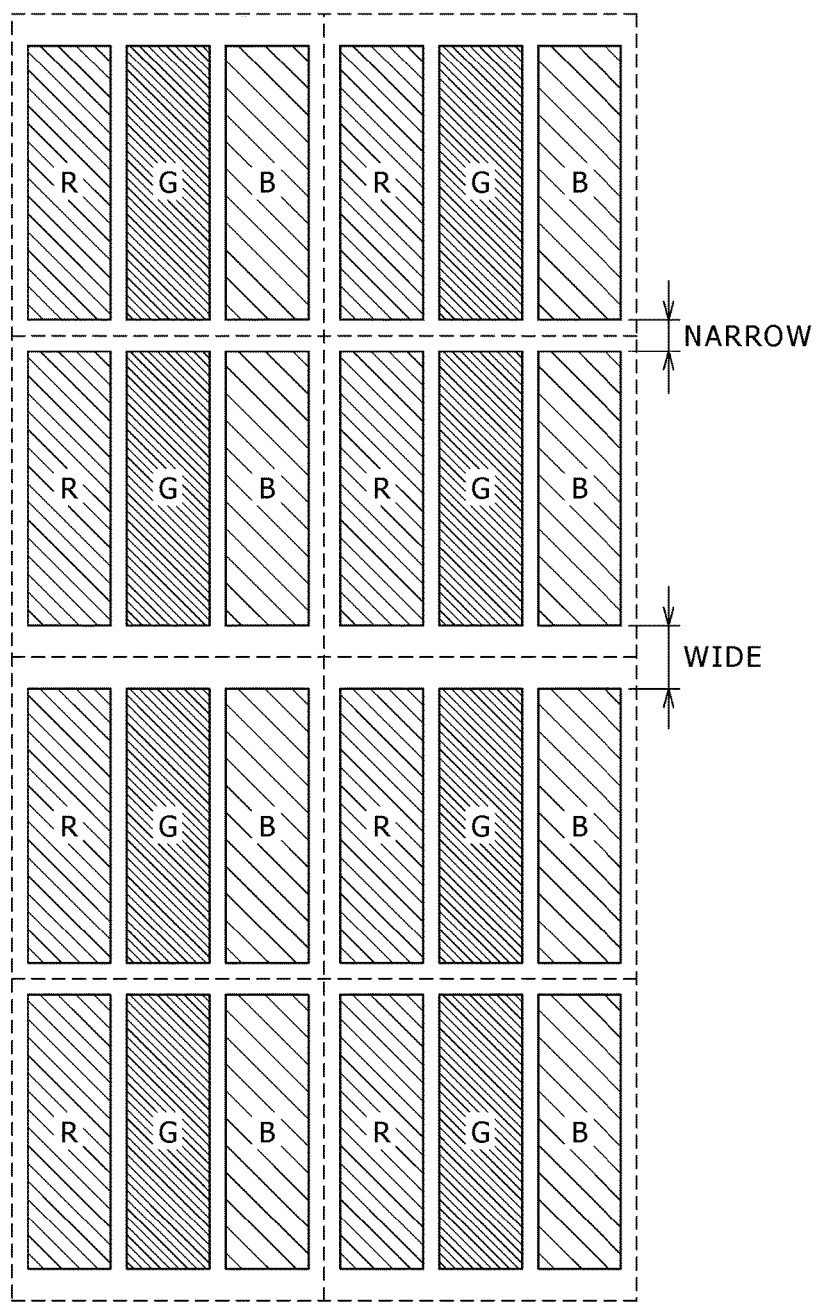
FIG. 8 is a schematic diagram showing one example of the color arrangement of pixels.

By employing such a layout, the following advantage can be achieved in addition to the same advantage as that by the first embodiment. Specifically, in the first embodiment, the distance between the sub-pixels 15 on the second row and the third row is larger than that between the sub-pixels 15 on the first row and the second row. Therefore, the color arrangement when the sub-pixels 15 are arranged for each of the RGB colors is as shown in FIG. 8 for example. In this case, the part involving fluctuation in the distance between the RGB pixels along the row direction exists continuously along the column direction across the entire pixel area. This will deteriorate the uniformity of the screen.

In contrast, in the second embodiment, the distance between the upper and lower two sub-pixels 15 of the same group (e.g., the distance between the sub-pixels 15 on the first row and the second row) is larger than that in the first embodiment. Thus, the difference in the pixel distance along the row direction is smaller. Consequently, the uniformity of the screen is more favorable compared with the first embodiment.

Third Embodiment

Figure 9:
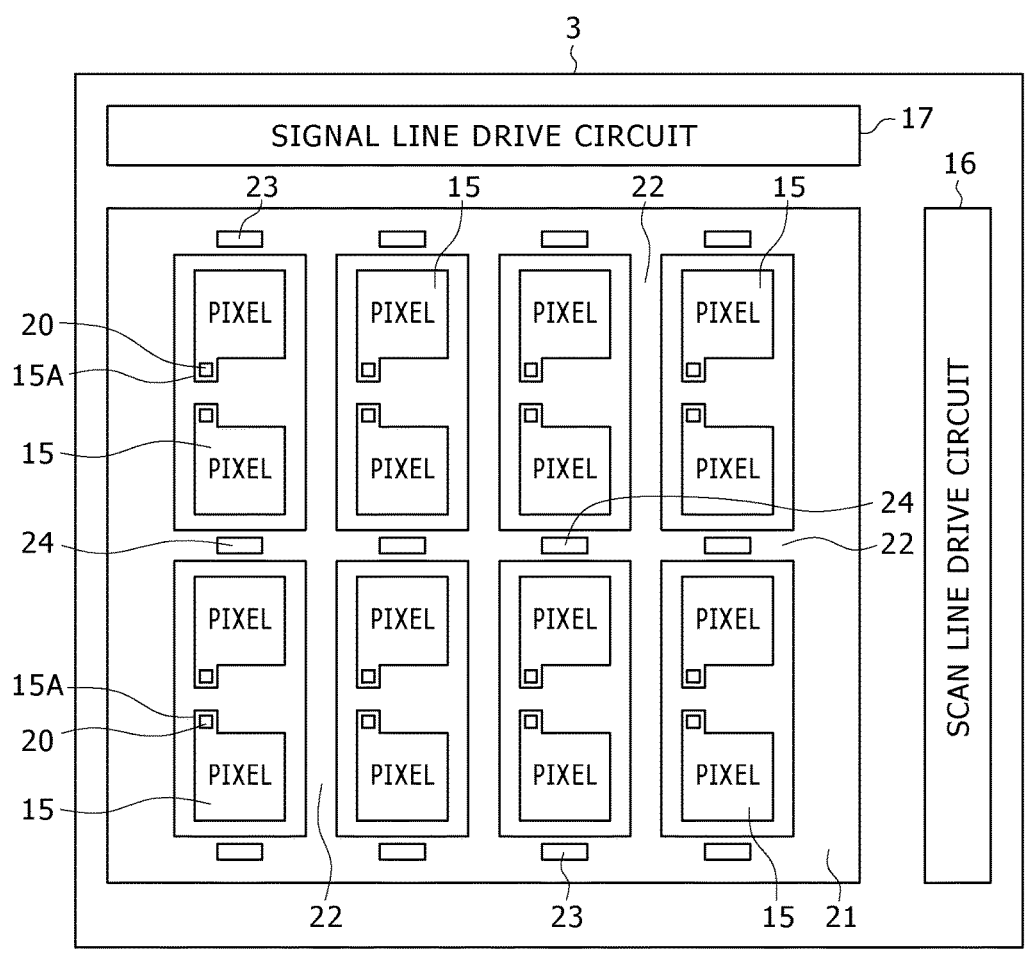
FIG. 9 is a schematic plan view showing the layout in an organic EL display device according to a third embodiment of the present invention.

FIG. 9 is a schematic plan view showing the layout in an organic EL display device according to a third embodiment of the present invention.

The third embodiment is the same as the first embodiment in that two sub-pixels 15 adjacent to each other along the row direction are regarded as one group and one auxiliary interconnect contact 24 is formed for each group, but is different from the first embodiment in the positional relationship between the pixel contacts 20 provided for the sub-pixels 15 in each group. Specifically, in the first embodiment, of the upper and lower two sub-pixels 15 of the same group, one sub-pixel 15 has the pixel contact 20 near the upper left corner thereof, and the other sub-pixel 15 has the pixel contact 20 near the lower left corner thereof. In contrast, in the third embodiment, of the upper and lower two sub-pixels 15 of the same group, one sub-pixel 15 has the pixel contact 20 near the lower left corner thereof, and the other sub-pixel 15 has the pixel contact 20 near the upper left corner thereof.

Therefore, the first embodiment and the third embodiment are the same in that the positions of the pixel contacts 20 of the upper and lower two sub-pixels 15 of the same group are inverted from each other along the row direction (vertically inverted). However, in the third embodiment, the pixel contacts 20 of the upper and lower two sub-pixels 15 of the same group are disposed to face each other along the row direction. This is the difference from the first embodiment.

Therefore, in the layout of the third embodiment, the distance between the upper and lower two sub-pixels 15 of the same group is larger than that in the first embodiment. Moreover, in the second embodiment, the area for forming one pixel contact 20 is ensured between the upper and lower two sub-pixels 15 of the same group. In the third embodiment, the area for forming two pixel contacts 20 is ensured between the upper and lower two sub-pixels 15 of the same group. Therefore, in the layout of the third embodiment, the distance between the upper and lower two sub-pixels 15 of the same group is larger also than that in the second embodiment.

By employing such a layout, the following advantage can be achieved in addition to the same advantage as that by the first embodiment. Specifically, in the third embodiment, the distance between the upper and lower two sub-pixels 15 of the same group (e.g., the distance between the sub-pixels 15 on the first row and the second row) is larger than that in the second embodiment. Thus, the difference in the pixel distance along the row direction is small, and therefore the sub-pixels 15 can be disposed with the intermediary of an equal distance along the row direction. Consequently, the uniformity of the screen is further enhanced compared with the second embodiment.

Fourth Embodiment

Figure 10:
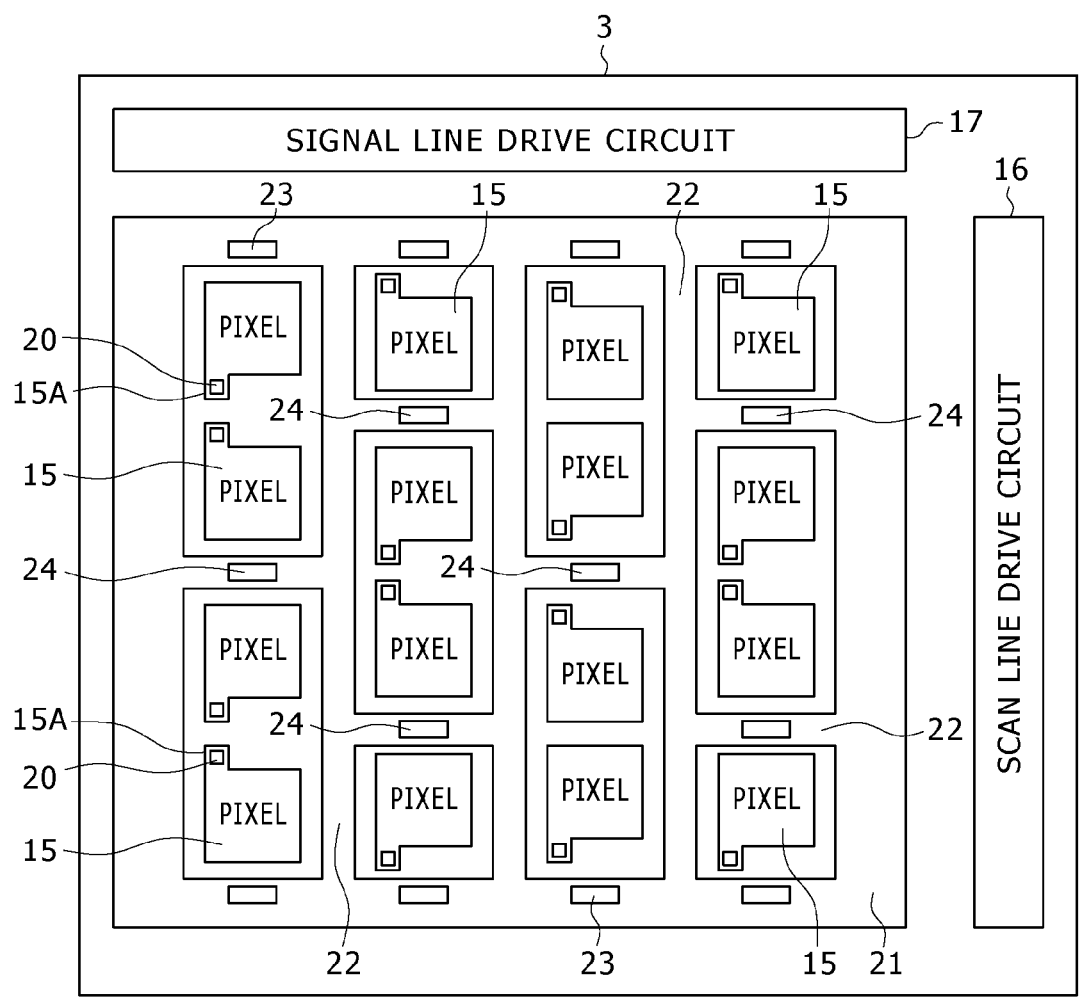
FIG. 10 is a schematic plan view showing the layout in an organic EL display device according to a fourth embodiment of the present invention.

FIG. 10 is a schematic plan view showing the layout in an organic EL display device according to a fourth embodiment of the present invention.

The fourth embodiment is the same as the third embodiment in that two sub-pixels 15 adjacent to each other along the row direction are regarded as one group and one auxiliary interconnect contact 24 is formed for each group, in that the positions of the pixel contacts 20 of the upper and lower two sub-pixels 15 of the same group are inverted from each other along the row direction (vertically inverted), and in that the pixel contacts 20 of the upper and lower two sub-pixels 15 of the same group are disposed to face each other along the row direction. However, the fourth embodiment is different from the third embodiment in that, regarding the combining of two sub-pixels adjacent to each other along the row direction into one pair, the position of the combining of the upper and lower two sub-pixels 15 in the row direction is different between the odd-numbered columns and the even-numbered columns.

Specifically, on the first column and the third column, the sub-pixels 15 on the first row and the second row are paired with each other, and the sub-pixels 15 on the third row and the fourth row are paired with each other. In contrast, on the second column and the fourth column, the sub-pixels 15 on the second row and the third row are paired with each other. Furthermore, although not shown in a drawing, when 16 sub-pixels 15 are arranged along the row direction on each column for example, the following sub-pixels 15 are paired with each other on the first column and the third column: the sub-pixels 15 on the first and second rows; the sub-pixels 15 on the third and fourth rows; . . . ; the sub-pixels 15 on the thirteenth and fourteenth rows; and the sub-pixels 15 on the fifteenth and sixteenth rows. In addition, the following sub-pixels 15 are paired with each other on the second column and the fourth column: the sub-pixels 15 on the second and third rows; the sub-pixels 15 on the fourth and fifth rows; . . . ; the sub-pixels 15 on the twelfth and thirteenth rows; and the sub-pixels 15 on the fourteenth and fifteenth rows.

By employing such a layout, the following advantage can be achieved in addition to the same advantage as that by the third embodiment. Specifically, the position of the combining of two sub-pixels adjacent to each other along the row direction on the odd-numbered columns is shifted in the row direction with respect to that on the even-numbered columns by the distance equivalent to one sub-pixel. Thus, the auxiliary interconnect contacts 24 are disposed in a staggered manner across the entire pixel area. Therefore, in the color arrangement when the sub-pixels 15 are arranged for each of the RGB colors, the part involving fluctuation in the distance between the RGB pixels along the row direction does not exist continuously along the column direction in the pixel area but dispersed uniformly across the entire pixel area. Consequently, the uniformity of the screen is very favorable.

Fifth Embodiment

Figure 11:
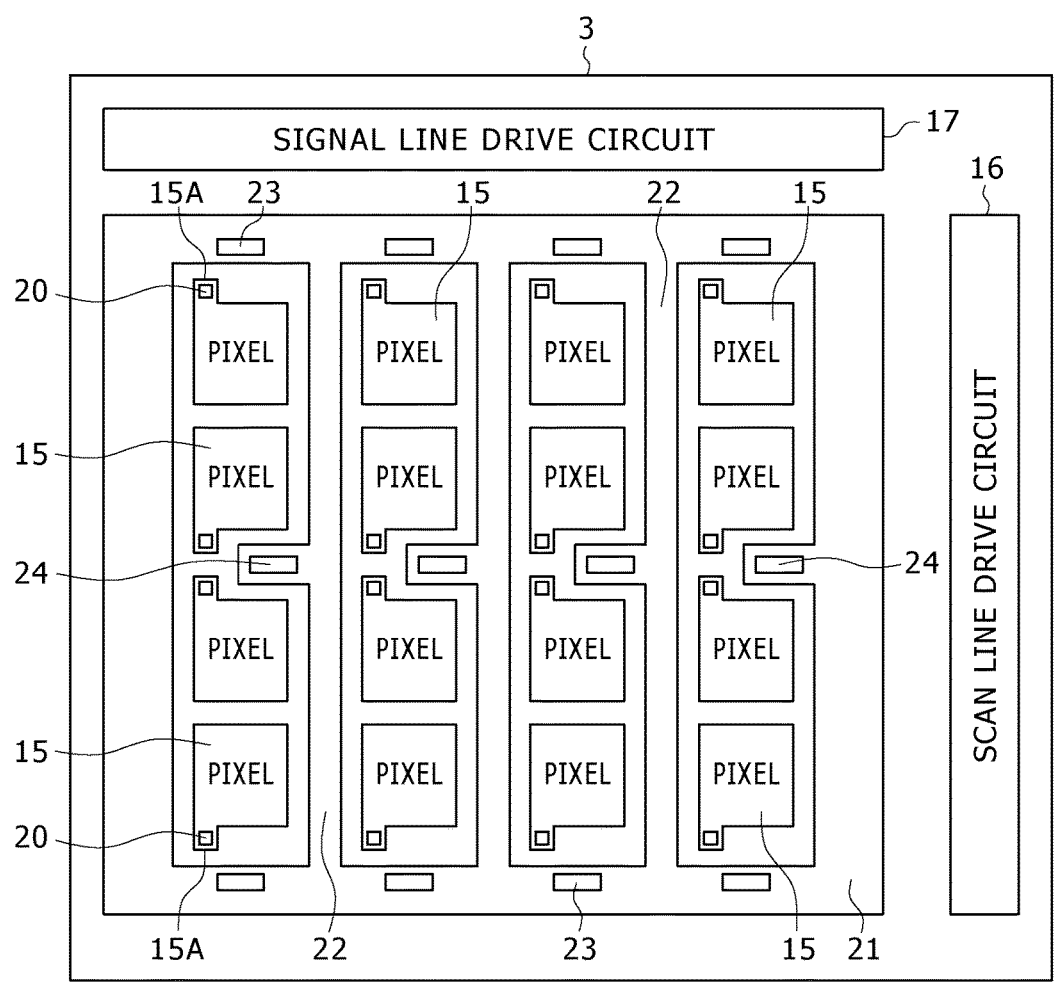
FIG. 11 is a schematic plan view showing the layout in an organic EL display device according to a fifth embodiment of the present invention.

FIG. 11 is a schematic plan view showing the layout in an organic EL display device according to a fifth embodiment of the present invention.

In the fifth embodiment, the number of sub-pixels 15 included in the same group is different from that in the first embodiment. Specifically, in the first embodiment, two sub-pixels 15 adjacent to each other along the row direction are regarded as one group, and one auxiliary interconnect contact 24 is formed for each group. In contrast, in the fifth embodiment, four sub-pixels 15 adjacent to each other along the row direction are regarded as one group, and one auxiliary interconnect contact 24 is formed for each group.

Of four sub-pixels 15 of the same group, the inner (center-side) two sub-pixels 15 have the pixel contacts 20 that are disposed to face each other along the row direction. The auxiliary interconnect 22 is partially extended between these two sub-pixels 15, and the auxiliary interconnect contact 24 is provided on this partially-extended auxiliary interconnect 22. Furthermore, although not shown in a drawing, when 16 sub-pixels 15 are arranged along the row direction on each column for example, the unit obtained by combining four sub-pixels 15 adjacent to each other along the row direction into one group as described above is repeatedly expanded along the row direction for four groups in such a way that the horizontal auxiliary interconnects 22 each having no auxiliary interconnect contact 24 thereon are interposed between the groups. Therefore, the horizontal auxiliary interconnects 22 do not exist between the sub-pixels 15 included in the same group but are formed only between the groups.

If such a layout is employed, it is sufficient to provide only one auxiliary interconnect contact 24 per four sub-pixels 15 regarding the row direction. In addition, because this auxiliary interconnect contact 24 is provided among the sub-pixels 15 of the same group, the sub-pixels 15 can be arranged along the row direction with higher density compared with the first embodiment. As a result, the fifth embodiment is advantageous in enhancing the aperture ratio of the pixels and the definition of displaying.

In the first to fifth embodiments, two or four sub-pixels 15 adjacent to each other along the row direction are regarded as one group, and one auxiliary interconnect contact 24 is formed for each group. However, the configuration is not limited thereto. For example, although not shown in a drawing, three or five or more sub-pixels 15 adjacent to each other along the row direction may be regarded as one group, and one auxiliary interconnect contact 24 may be formed for each group. The number of auxiliary interconnect contacts 24 formed for each group may be any as long as it is smaller than the number of sub-pixels 15 included in the same group, like the case in which four sub-pixels 15 adjacent to each other along the row direction are regarded as one group and two auxiliary interconnect contacts 24 are formed for each group. Moreover, if four sub-pixels 15 adjacent to each other along the row direction are combined into one group, the uniformity of the screen can be enhanced by shifting the position of the combining of the sub-pixels 15 on the odd-numbered columns in the row direction with respect to that on the even-numbered columns similarly to the fourth embodiment.

Sixth Embodiment

Figure 12:
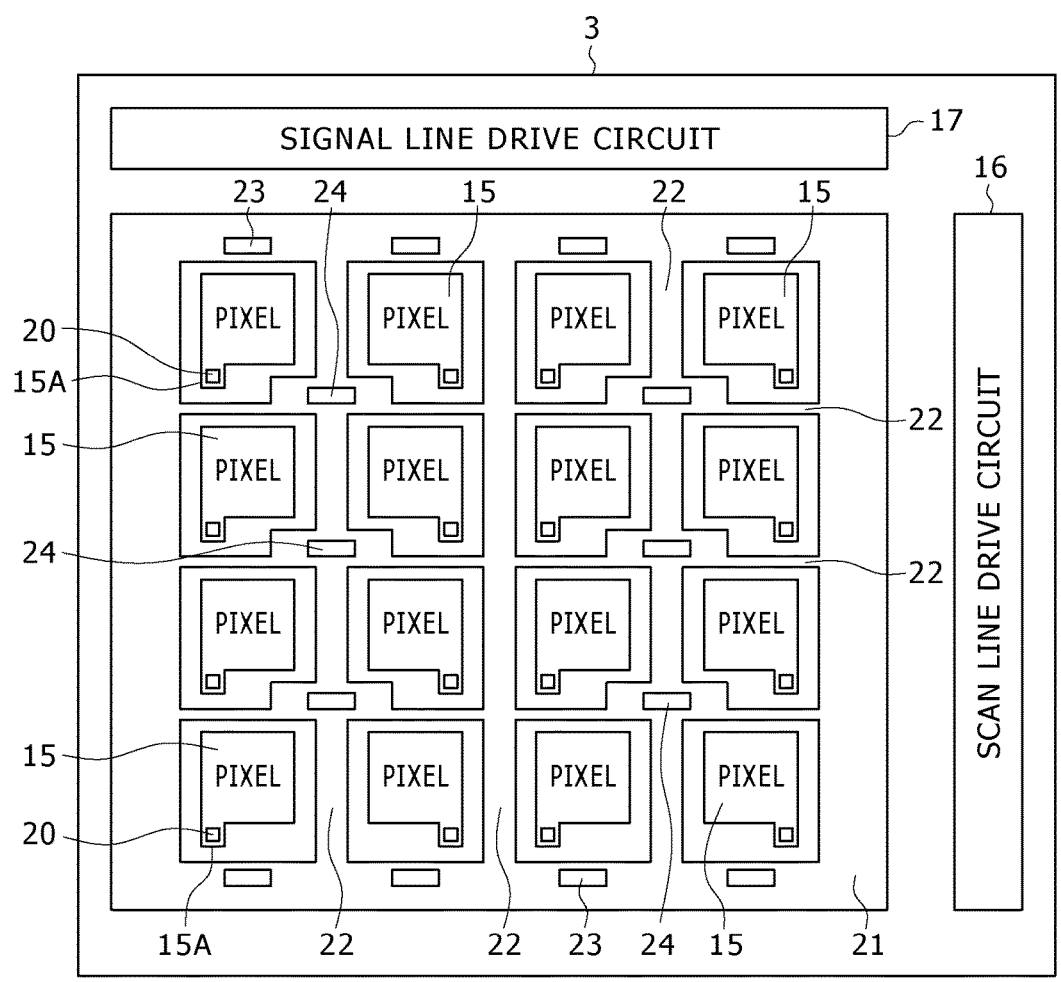
FIG. 12 is a schematic plan view showing the layout in an organic EL display device according to a sixth embodiment of the present invention.

FIG. 12 is a schematic plan view showing the layout in an organic EL display device according to a sixth embodiment of the present invention.

In the sixth embodiment, two sub-pixels 15 adjacent to each other along the column direction are regarded as one group, and one auxiliary interconnect contact 24 is formed for each group. Specifically, regarding the sub-pixels 15 on the first row, the sub-pixels 15 on the first column and the second column are paired with each other, and the sub-pixels 15 on the third column and the fourth column are paired with each other. Furthermore, one auxiliary interconnect contact 24 is formed for each group. In addition, of the left and right two sub-pixels 15 of the same group, the left sub-pixel 15 has the pixel contact 20 near the lower left corner thereof, and the right sub-pixel 15 has the pixel contact 20 near the lower right corner thereof.

The auxiliary interconnect contact 24 is formed on the vertical auxiliary interconnect 22 that runs between the left and right two sub-pixels 15 of the same group. More specifically, between the left and right two sub-pixels 15 of the same group, the interconnect width of the auxiliary interconnect 22 is partially increased at the intersection of the vertical and horizontal auxiliary interconnects 22, and the auxiliary interconnect contact 24 is provided on this partially-widened part. The auxiliary interconnect contact 24 is disposed between the pixel contacts 20 of the left and right two sub-pixels 15 of the same group (at an intermediate part). This feature applies also to the sub-pixels 15 on the second, third, and fourth rows.

By employing such a layout, the interconnect width of the horizontal auxiliary interconnects 22 formed between the sub-pixels 15 adjacent to each other along the row direction can be decreased, and thus the sub-pixels 15 can be arranged along the row direction with higher density, compared with the layout of FIG. 24. Thus, enhancement in the aperture ratio of the pixels and the definition of displaying can be realized similarly to the first embodiment.

Seventh Embodiment

Figure 13:
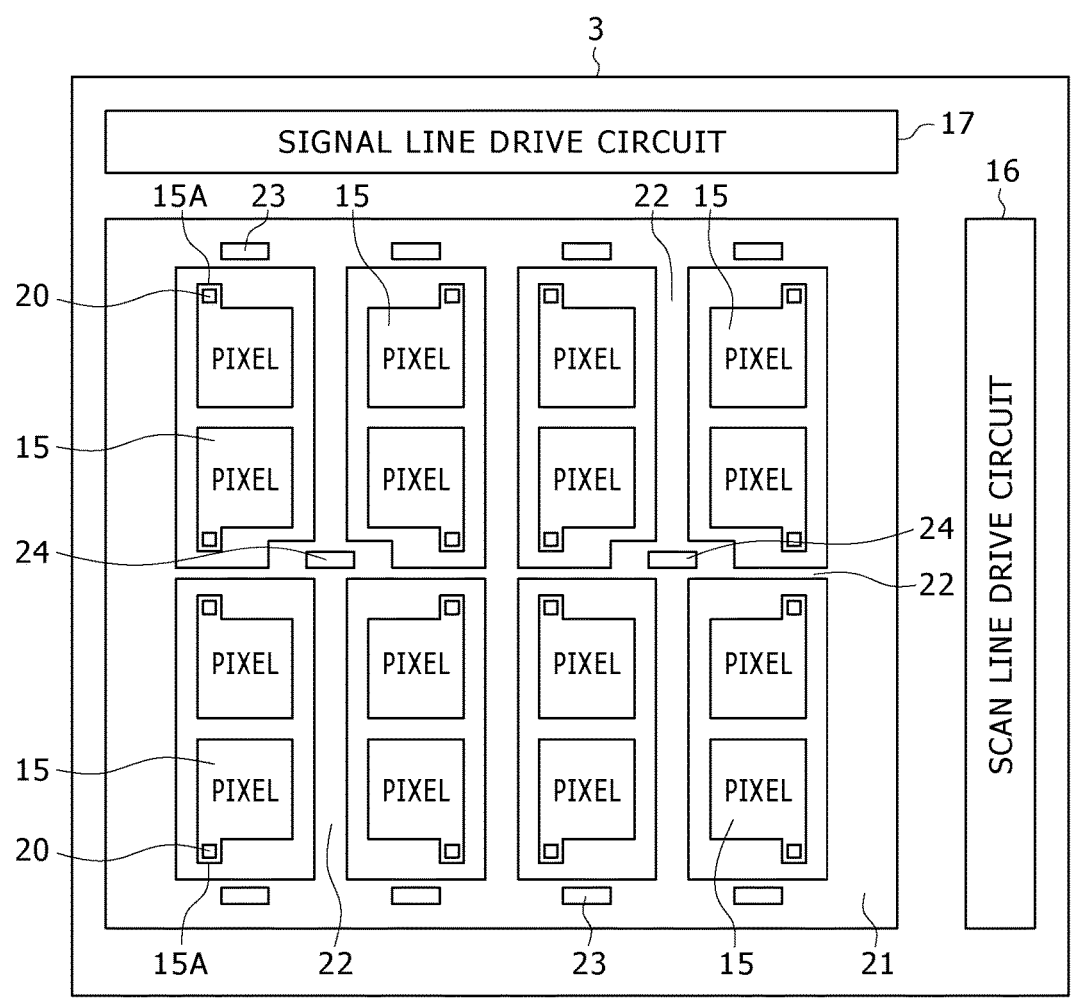
FIG. 13 is a schematic plan view showing the layout in an organic EL display device according to a seventh embodiment of the present invention.

FIG. 13 is a schematic plan view showing the layout in an organic EL display device according to a seventh embodiment of the present invention.

In the seventh embodiment, total four sub-pixels 15 arising from combination of two sub-pixels 15 adjacent to each other along the row direction and two sub-pixels 15 adjacent to each other along the column direction are regarded as one group, and one auxiliary interconnect contact 24 is formed for each group. Specifically, of the sub-pixels 15 on four rows×four columns, the following sub-pixels 15 are regarded as one group: four sub-pixels 15 on the first and second rows and the first and second columns; four sub-pixels 15 on the first and second rows and the third and fourth columns; four sub-pixels 15 on the third and fourth rows and the first and second columns; four sub-pixels 15 on the third and fourth rows and the third and fourth columns.

Furthermore, although not shown in a drawing, when 16 sub-pixels 15 are arranged along the row direction on each column for example, the unit obtained by combining four sub-pixels 15 adjacent to each other along the row and column directions into one group as described above is repeatedly expanded along the row direction for four groups in such a way that the horizontal auxiliary interconnects 22 each having the auxiliary interconnect contact 24 thereon are interposed between the groups.

If such a layout is employed, the number of horizontal auxiliary interconnects 22 is smaller compared with the sixth embodiment, and thus the sub-pixels 15 can be arranged along the row direction with higher density. Consequently, the seventh embodiment is advantageous in enhancing the aperture ratio of the pixels and the definition of displaying.

Eighth Embodiment

Figure 14:
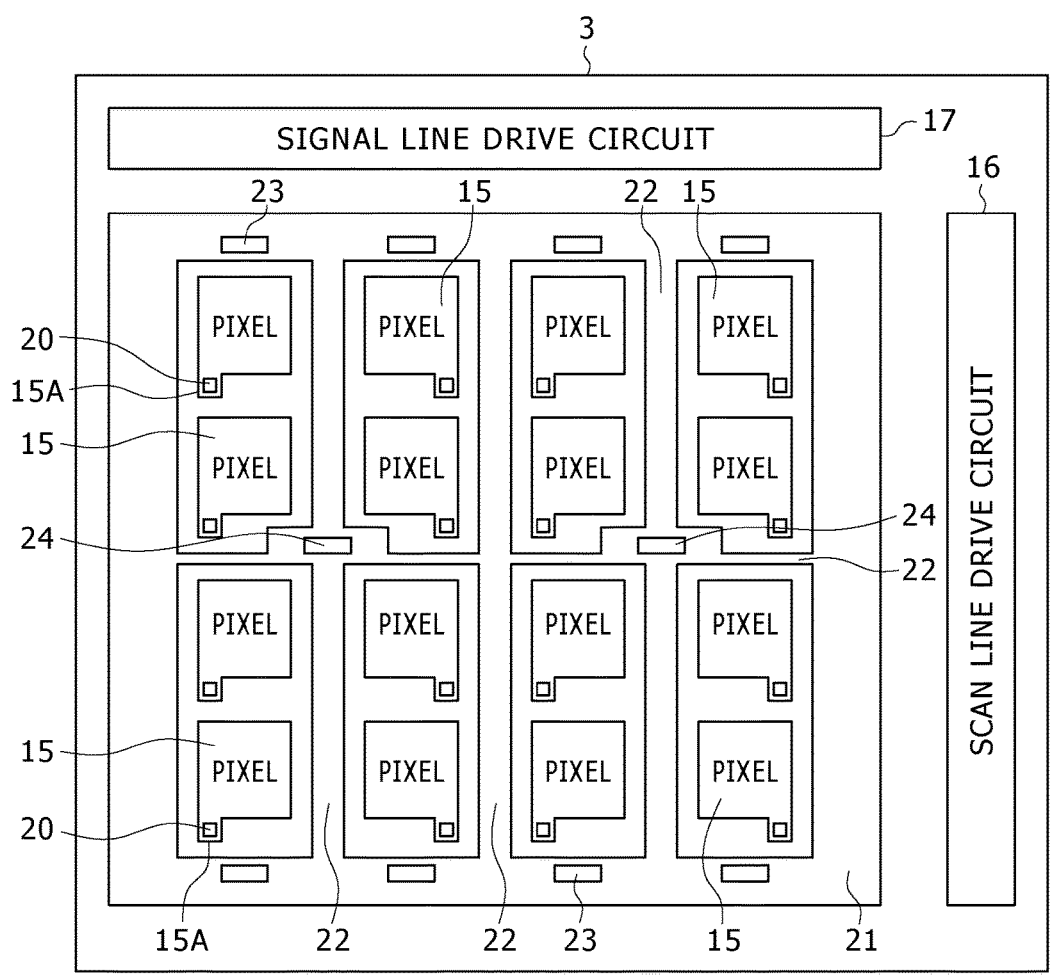
FIG. 14 is a schematic plan view showing the layout in an organic EL display device according to an eighth embodiment of the present invention.

FIG. 14 is a schematic plan view showing the layout in an organic EL display device according to an eighth embodiment of the present invention.

The eighth embodiment is the same as the seventh embodiment in that four sub-pixels 15 adjacent to each other along the row and column directions are regarded as one group and one auxiliary interconnect contact 24 is formed for each group, but is different from the seventh embodiment in the positional relationship among the pixel contacts 20 of four sub-pixels 15 of the same group.

Specifically, in the seventh embodiment, the positions of the pixel contacts 20 of two sub-pixels 15 adjacent to each other along the row direction, of four sub-pixels 15 of the same group, are inverted from each other along the row direction (vertically inverted). In contrast, in the eighth embodiment, the positions of the pixel contacts 20 of two sub-pixels 15 adjacent to each other along the row direction, of four sub-pixels 15 of the same group, are not inverted from each other along the row direction but aligned with each other at the same position (lower left or lower right).

By employing such a layout, the following advantage is achieved in addition to the same advantage as that by the seventh embodiment. Specifically, the distance between the sub-pixels 15 along the row direction is equalized compared with the seventh embodiment. Thus, the uniformity of the screen is favorable.

Ninth Embodiment

Figure 15:
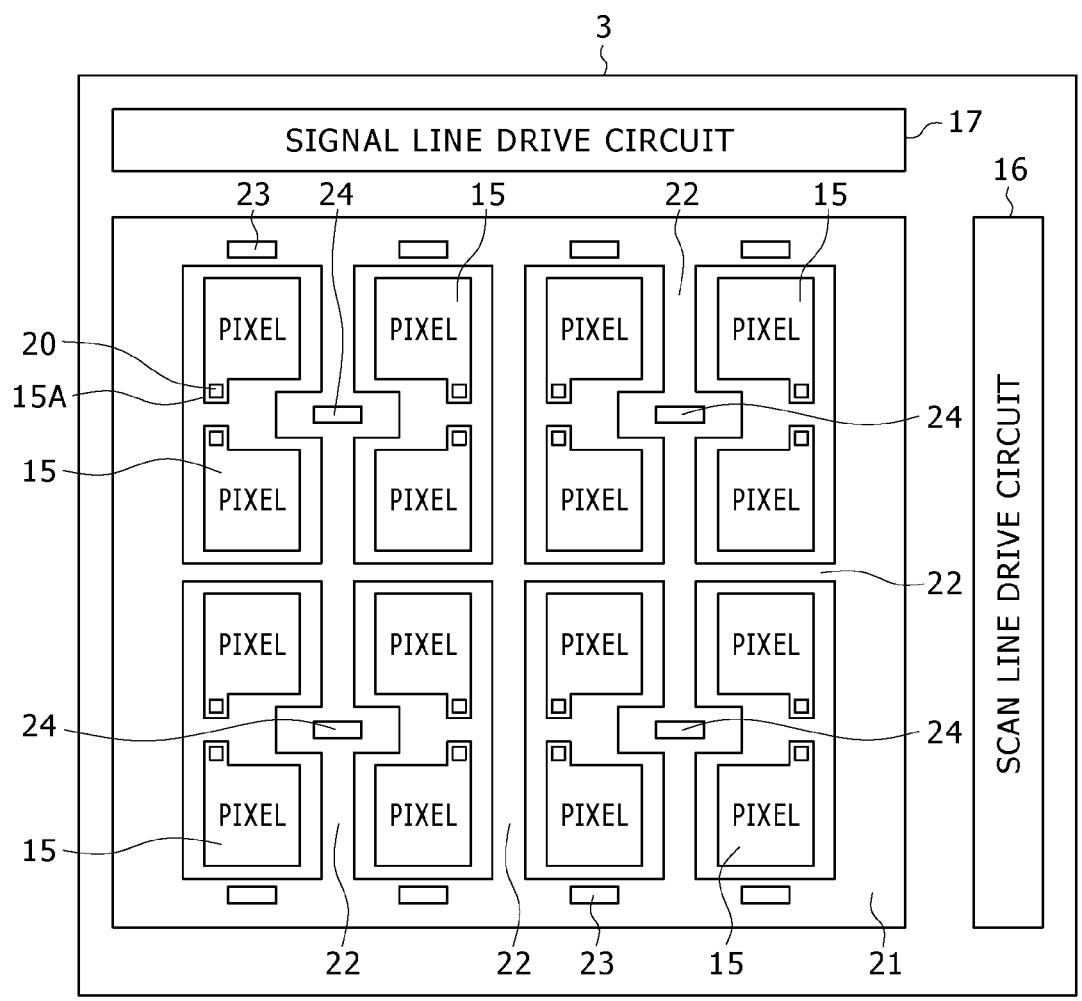
FIG. 15 is a schematic plan view showing the layout in an organic EL display device according to a ninth embodiment of the present invention.

FIG. 15 is a schematic plan view showing the layout in an organic EL display device according to a ninth embodiment of the present invention.

The ninth embodiment is the same as the seventh embodiment in that four sub-pixels 15 adjacent to each other along the row and column directions are regarded as one group and one auxiliary interconnect contact 24 is formed for each group, but is different from the seventh embodiment in the positions of the pixel contacts 20 corresponding to four sub-pixels 15 of the same group.

Specifically, in the seventh embodiment, the auxiliary interconnect contact 24 is disposed between the pixel contacts 20 of the lower two sub-pixels 15 of four sub-pixels 15 of the same group. In contrast, in the ninth embodiment, the auxiliary interconnect contact 24 is provided at the center of four sub-pixels 15 of the same group.

More specifically, in the ninth embodiment, of four sub-pixels 15 of the same group, the upper left sub-pixel 15 has the pixel contact 20 near the lower left corner thereof, the upper right sub-pixel 15 has the pixel contact 20 near the lower right corner thereof, the lower left sub-pixel 15 has the pixel contact 20 near the upper left corner thereof, and the lower right sub-pixel 15 has the pixel contact 20 near the upper right corner thereof. Based on this structure, the interconnect width of the vertical auxiliary interconnect 22 is partially increased in the area surrounded by these four sub-pixels 15, and the auxiliary interconnect contact 24 is formed on this partially-widened part.

By employing such a layout, the same advantage as that by the eighth embodiment can be achieved.

Tenth Embodiment

Figure 16:
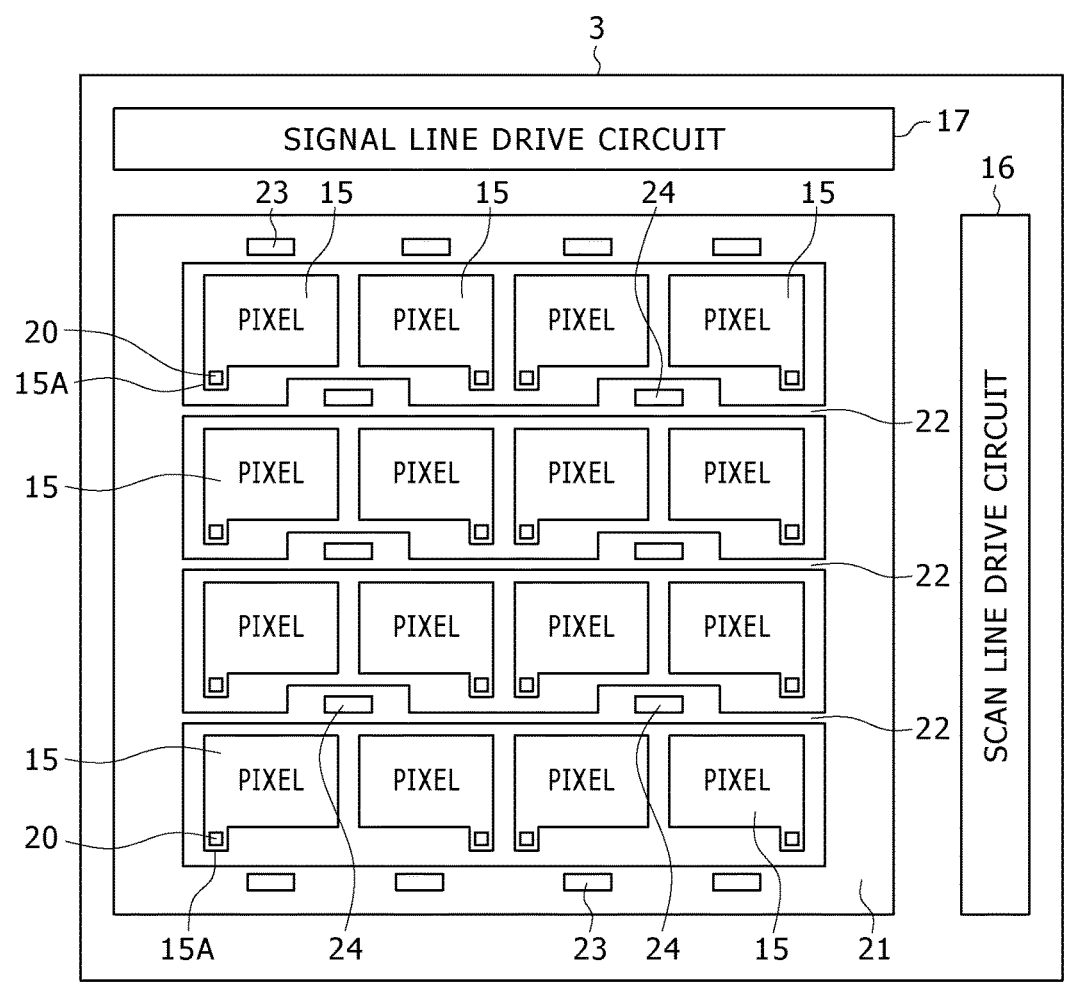
FIG. 16 is a schematic plan view showing the layout in an organic EL display device according to a tenth embodiment of the present invention.

FIG. 16 is a schematic plan view showing the layout in an organic EL display device according to a tenth embodiment of the present invention.

In the tenth embodiment, four sub-pixels 15 adjacent to each other along the column direction are regarded as one group, and two auxiliary interconnect contacts 24 are formed for each group. More specifically, if the horizontal four sub-pixels 15 of the same group are defined as the first sub-pixel 15, the second sub-pixel 15, the third sub-pixel 15, and the fourth sub-pixel 15, respectively, from the left end to the right end, the first sub-pixel 15 has the pixel contact 20 near the lower left corner thereof, the second sub-pixel 15 has the pixel contact 20 near the lower right corner thereof, the third sub-pixel 15 has the pixel contact 20 near the lower left corner thereof, and the fourth sub-pixel 15 has the pixel contact 20 near the lower right corner thereof. That is, the positions of the pixel contacts 20 of the sub-pixels 15 adjacent to each other along the column direction are inverted from each other along the column direction. Thus, of the horizontal four sub-pixels 15 of the same group, the left-side two sub-pixels 15 and the right-side two sub-pixels 15 have the positional relationship of horizontal symmetry.

Furthermore, although not shown in a drawing, when 16 sub-pixels 15 are arranged along the column direction on each row for example, the unit obtained by combining four sub-pixels 15 adjacent to each other along the column direction into one group as described above is repeatedly expanded along the column direction for four groups in such a way that the vertical auxiliary interconnects 22 each having no auxiliary interconnect contact 24 thereon are interposed between the groups. Therefore, the vertical auxiliary interconnects 22 do not exist between the sub-pixels 15 included in the same group but are formed only between the groups.

If such a layout is employed, the number of vertical auxiliary interconnects 22 is smaller compared with the sixth embodiment, and thus the sub-pixels 15 can be arranged along the column direction with higher density. Consequently, the tenth embodiment is advantageous in enhancing the aperture ratio of the pixels and the definition of displaying.

Eleventh Embodiment

Figure 17:
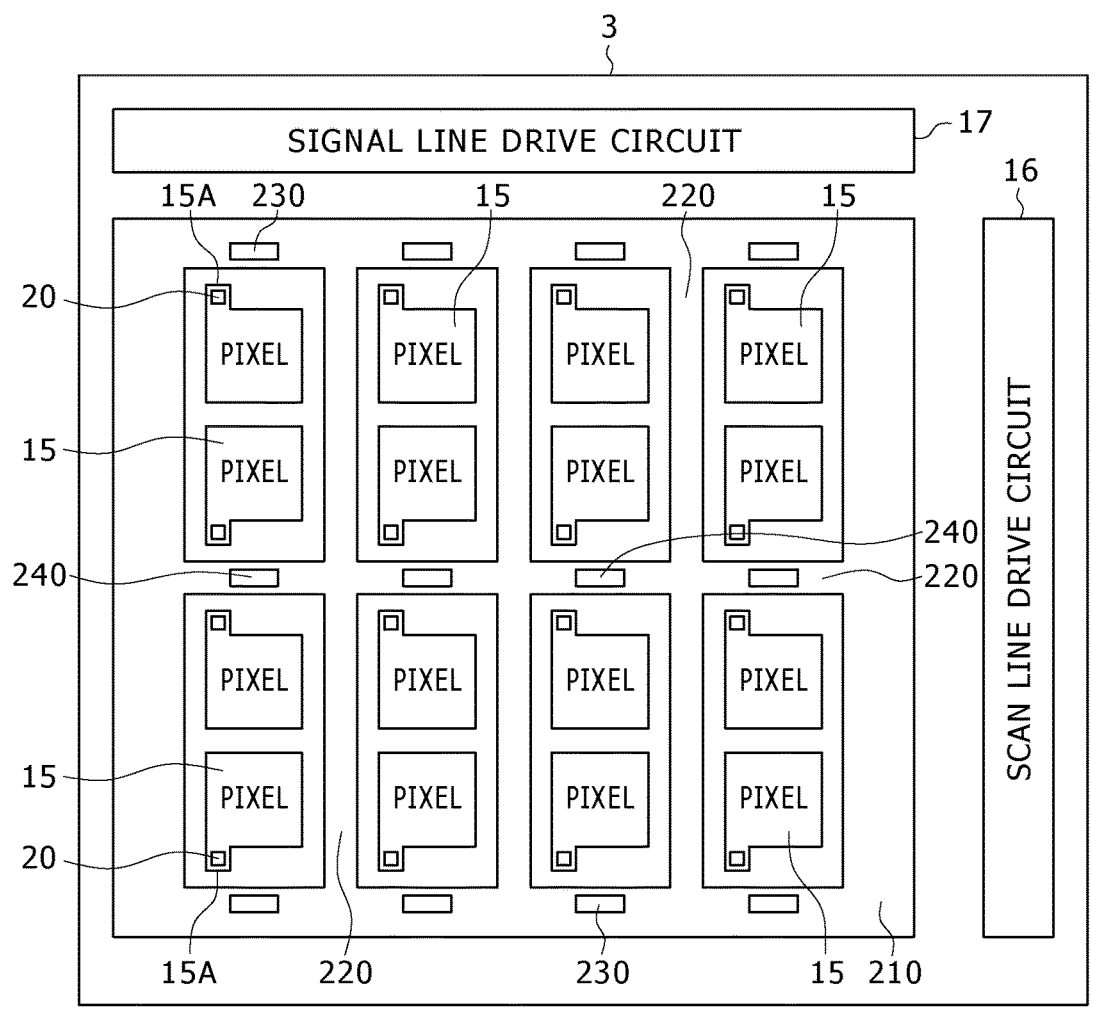
FIG. 17 is a schematic plan view showing the layout in an organic EL display device according to an eleventh embodiment of the present invention.
Figure 18:
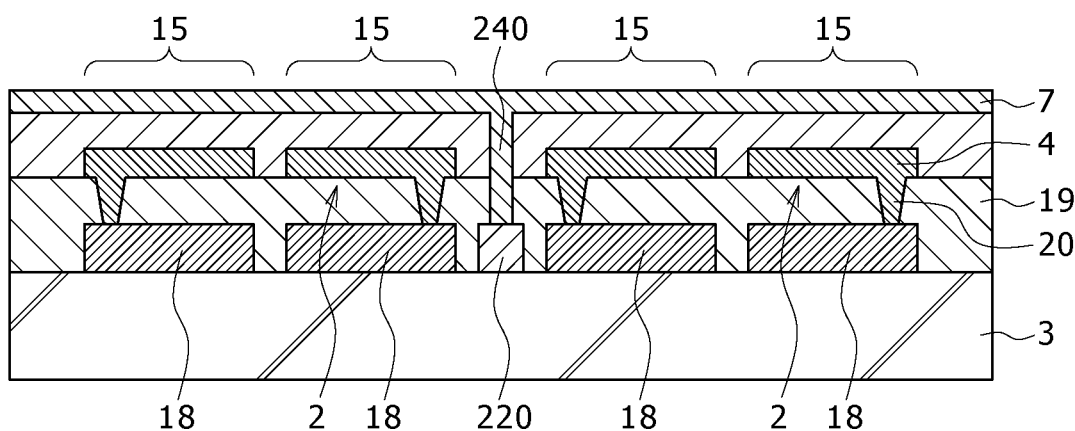
FIG. 18 is a sectional view of major part of the organic EL display device of the eleventh embodiment of the present invention.

FIG. 17 is a schematic plan view showing the layout in an organic EL display device according to an eleventh embodiment of the present invention. FIG. 18 is a sectional view of major part of the organic EL display device of the eleventh embodiment.

In the above-described first to tenth embodiments, the auxiliary interconnect contact 24 for electrically connecting the upper electrode 7 to the auxiliary interconnect 22 at the same layer level as that of the lower electrode 4 is formed as shown in FIG. 6. On the other hand, in the eleventh embodiment, an auxiliary interconnect 220 is formed at the same layer level as that of the pixel circuit 18 on the element formation substrate 3 as shown in FIG. 18. Furthermore, an auxiliary interconnect contact 240 for electrically connecting the upper electrode 7 to the auxiliary interconnect 220 is formed. It is preferable that the auxiliary interconnect 220 be formed of the same layer as, of the layers included in the pixel circuit 18, the electrically-conductive layer having the lowest resistance, such as a layer composed of an aluminum material. The sheet resistance of the auxiliary interconnect 220 composed of aluminum is sufficiently lower than that of the upper electrode 7 (by a factor of about one-thousandth), and thus the resistance of the upper electrode 7 can be decreased by electrically connecting the upper electrode 7 to the auxiliary interconnect 220.

As shown in FIG. 17, an auxiliary electrode 210 and the auxiliary interconnects 220 are formed at the same layer level as that of the pixel circuit 18. Therefore, although the auxiliary electrode 210 and the auxiliary interconnects 220 are electrically connected to each other, the lower electrode 4, which is formed on the planarization film 19 for each sub-pixel 15, is electrically insulated from the auxiliary electrode 210 and the auxiliary interconnects 220.

The upper electrode 7 is electrically connected to the auxiliary electrode 210 via plural auxiliary electrode contacts 230. Furthermore, the upper electrode 7 is electrically connected to the auxiliary interconnects 220 via plural auxiliary interconnect contacts 240. The respective auxiliary electrode contacts 230 are provided in the formation area of the auxiliary electrode 210 surrounding the pixel area. The respective auxiliary interconnect contacts 240 are provided in the formation area (within the interconnect width) of the auxiliary interconnects 220 disposed in the pixel area. Thus, the auxiliary electrode contacts 230 are disposed outside the pixel area, and the auxiliary interconnect contacts 240 are disposed inside the pixel area.

By employing such a layout, if the pixel circuit 18 is formed in an area smaller than the lower electrode 4 for example, the auxiliary interconnect 220 having a predetermined width can be formed between the adjacent pixel circuits 18 and the pitch of the sub-pixels 15 can be decreased, compared with the first embodiment.

Application Examples

The organic EL display device 1 having the above-described configuration can be applied to various kinds of the electronic apparatus shown in FIGS. 19 to 23. Specifically, the organic EL display device 1 can be applied to the electronic apparatus in any field that displays an image or video based on a video signal input to the electronic apparatus or produced in the electronic apparatus, such as a digital camera, laptop personal computer, a portable terminal apparatus typified by a cellular phone, and video camera.

Figure 19:
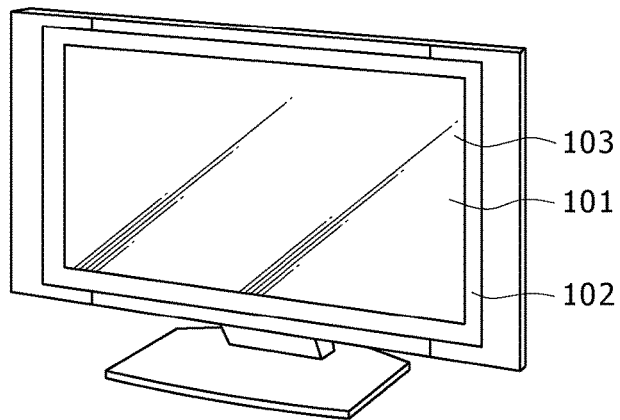
FIG. 19 is a perspective view showing a television as a first application example.

FIG. 19 is a perspective view showing a television as a first application example. The television according to the present application example includes a video display screen 101 composed of a front panel 102, a filter glass 103, and so on, and the above-described organic EL display device 1 can be applied to the video display screen 101.

Figure 20A:
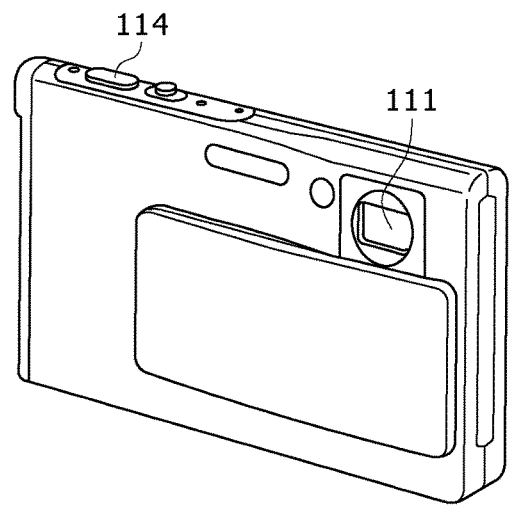
FIGS. 20A and 20B are diagrams showing a digital camera as a second application example.
Figure 20B:
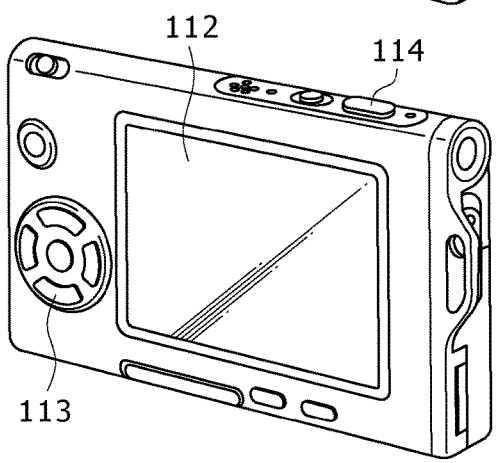

FIGS. 20A and 20B are diagrams showing a digital camera as a second application example: FIG. 20A is a front-side perspective view and FIG. 20B is a rear-side perspective view. The digital camera according to the present application example includes a light emitter 111 for flash, a display part 112, a menu switch 113, a shutter button 114, and so on, and the above-described organic EL display device 1 can be applied to the display part 112.

Figure 21:
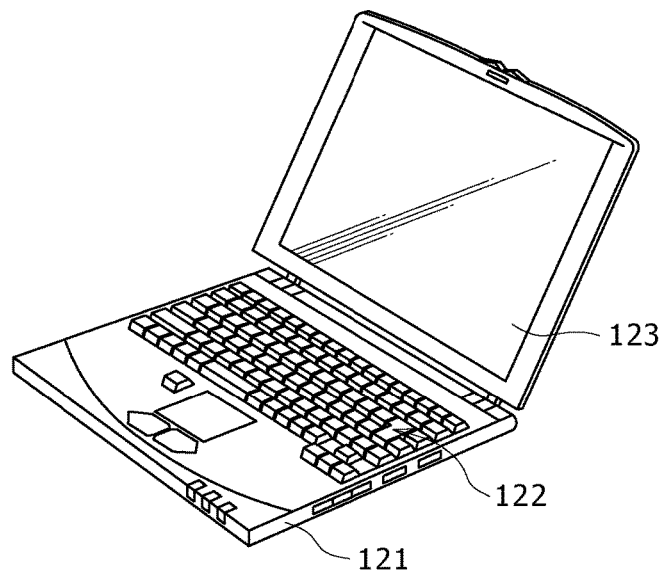
FIG. 21 is a perspective view showing a laptop personal computer as a third application example.

FIG. 21 is a perspective view showing a laptop personal computer as a third application example. The laptop personal computer according to the present application example includes in a main body 121 thereof a keyboard 122 operated in inputting of characters and so forth, a display part 123 for displaying images, and so on. The above-described organic EL display device 1 can be applied to the display part 123.

Figure 22:
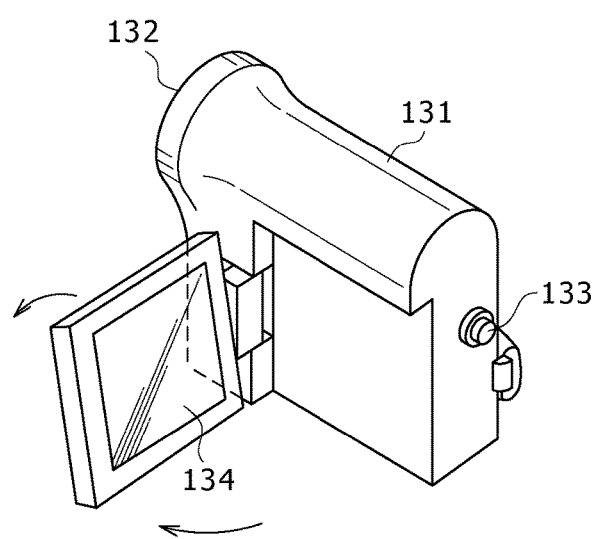
FIG. 22 is a perspective view showing a video camera as a fourth application example.

FIG. 22 is a perspective view showing a video camera as a fourth application example. The video camera according to the present application example includes a main body 131, a lens 132 that is disposed on the front side of the camera and used to capture a subject image, a start/stop switch 133 for imaging operation, a display part 134, and so on. The above-described organic EL display device 1 can be applied to the display part 134.

FIGS. 23A to 23G are diagrams showing a cellular phone as a portable terminal apparatus as a fifth application example: FIGS. 23A and 23B are a front view and side view, respectively, of the opened state, and FIGS. 23C, 23D, 23E, 23F, and 23G are a front view, left-side view, right-side view, top view, and bottom view, respectively, of the closed state. The cellular phone according to the present application example includes an upper casing 141, a lower casing 142, a connection (hinge) 143, a display 144, a sub-display 145, a picture light 146, a camera 147, and so on. The above-described organic EL display device 1 can be applied to the display 144 and the sub-display 145.

It should be understood by those skilled in the art that various modifications, combinations, sub-combinations and alterations may occur depending on design requirements and other factor in so far as they are within the scope of the appended claims or the equivalents thereof.

What is claimed is:

1. A display device, comprising:
    a plurality of pixel circuits including a first pixel circuit, a second pixel circuit, a third pixel circuit, and a fourth pixel circuit, which are arranged along a column direction;
    a plurality of pixel electrodes including a first pixel electrode, a second pixel electrode, a third pixel electrode, and a fourth pixel electrode; and
    a potential wiring formed on a same layer as the pixel electrodes and extending along a row direction which crosses the column direction,
    wherein,
        the first pixel electrode is connected to the first pixel circuit and includes, in a plan view, a first main portion and a first protruding portion smaller than the first main portion,
        the second pixel electrode is connected to the second pixel circuit and includes, in the plan view, a second main portion and a second protruding portion smaller than the second main portion,
        the third pixel electrode is connected to the third pixel circuit and includes, in the plan view, a third main portion and a third protruding portion smaller than the third main portion, the fourth pixel electrode is connected to the fourth pixel circuit and includes, in the plan view, a fourth main portion and a fourth protruding portion smaller than the fourth main portion, the first protruding portion includes a first contact connected to the first pixel circuit, the second protruding portion includes a second contact connected to second pixel circuit, the third protruding portion includes a third contact connected to the third pixel circuit, the fourth protruding portion includes a fourth contact connected to the fourth pixel circuit, in the plan view, the potential wiring is located between the second pixel electrode and the third pixel electrode, in the plan view, the potential wiring is opposed to the second protruding portion across the second main portion, in the plan view, the potential wiring is opposed to the third protruding portion across the third main portion, in the plan view, the potential wiring is not located between the first pixel electrode and the second pixel electrode, and in the plan view, the potential wiring is not located between the third pixel electrode and the fourth pixel electrode.

2. The display device according to claim 1, wherein the potential wiring includes silver (Ag).

3. The display device according to claim 1, further comprising an upper electrode covering the plurality of pixel electrodes, and electrically connected to the potential wiring.

4. The display device according to claim 1, wherein the potential wiring surrounds the first pixel electrode and the second pixel electrode.

* * * * *